United States Patent
Naik et al.

(10) Patent No.: US 9,817,088 B2
(45) Date of Patent: Nov. 14, 2017

(54) VOLTAGE-TUNABLE MAGNETIC DEVICES FOR COMMUNICATION APPLICATIONS

(71) Applicant: GLOBALFOUNDRIES Singapore Pte. Ltd., Singapore (SG)

(72) Inventors: Vinayak Bharat Naik, Singapore (SG); Deepanjan Datta, Singapore (SG); Murali V R M Kota, Clifton Park, NY (US)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/075,088

(22) Filed: Mar. 18, 2016

(65) Prior Publication Data
US 2016/0274198 A1    Sep. 22, 2016

Related U.S. Application Data

(60) Provisional application No. 62/135,655, filed on Mar. 19, 2015.

(51) Int. Cl.
*G01R 33/09* (2006.01)
*H01L 43/02* (2006.01)
(Continued)

(52) U.S. Cl.
CPC ........... *G01R 33/098* (2013.01); *H01L 27/22* (2013.01); *H01L 43/02* (2013.01); *H01L 43/08* (2013.01); *H01L 43/10* (2013.01); *H01L 43/12* (2013.01)

(58) Field of Classification Search
None
See application file for complete search history.

(56) References Cited

U.S. PATENT DOCUMENTS 7,230,308 B2 * 6/2007 Iwata ................ B82Y 10/00
257/295
7,453,412 B2   11/2008 Murali et al.
(Continued)

OTHER PUBLICATIONS

Wang et al., "Piezoelectric control of magnetic dynamics in Co/Pb(Mg1/3Nb2/3)O3—PbTiO3 heterostructure", Applied Physics Letters 105, 062407 (2014).*

(Continued)

*Primary Examiner* — Erik Kielin
(74) *Attorney, Agent, or Firm* — Horizon IP Pte Ltd.

(57) ABSTRACT

Magnetic devices and methods for forming a magnetic device are disclosed. The magnetic device includes a MTJ element. The MTJ element has first and second MTJ terminals which include first and second electrodes. The free layer of the MTJ element includes a natural precessional frequency which undergoes Rabi oscillation in the presence of a radio frequency (RF) matching the natural precessional frequency. A strain induced magnetoelectric (SIM) unit contacts one of the electrodes proximate to the free layer of the MTJ element while a digital line is coupled to the SIM unit. A desired voltage is provided on the digital line to cause the SIM unit to produce a desired strain on the electrode proximate to the free layer to tune the precessional frequency of the free layer to a desired precessional frequency for detecting a desired RF by the magnetic device. The desired RF causes a change in current through the MTJ element due to Rabi oscillation.

16 Claims, 36 Drawing Sheets

(51) Int. Cl.
*H01L 43/08* (2006.01)
*H01L 43/10* (2006.01)
*H01L 43/12* (2006.01)
*H01L 27/22* (2006.01)

(56) References Cited

U.S. PATENT DOCUMENTS

2006/0118842 A1* 6/2006 Iwata .................... B82Y 10/00
   257/295
2012/0100810 A1* 4/2012 Oksanen ............. H01F 10/3254
   455/67.11
2015/0294708 A1* 10/2015 Annunziata ......... G11C 11/1675
   365/158

OTHER PUBLICATIONS

Nian X. Sun et al., "Voltage Control of Magnetism in Multiferroic Heterostructures and Devices", SPIN, 2012, vol. 2, No. 3, World Scientific Publishing Co Pte Ltd.

* cited by examiner

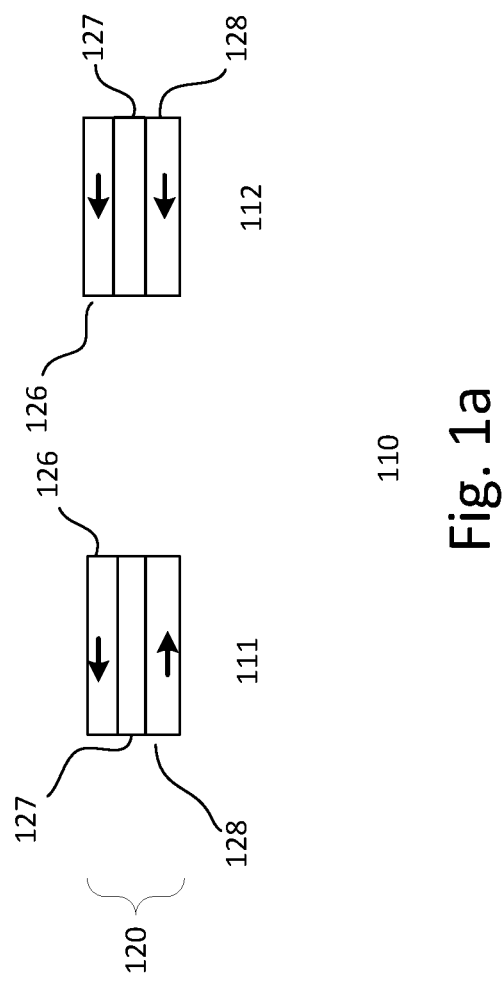

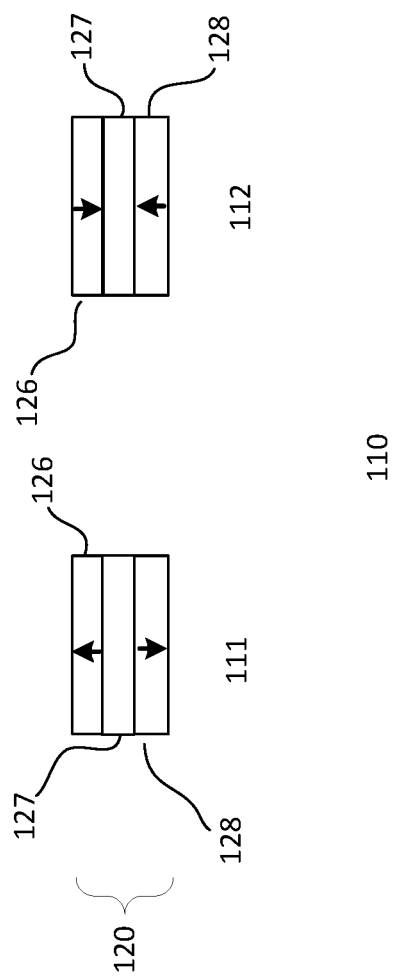

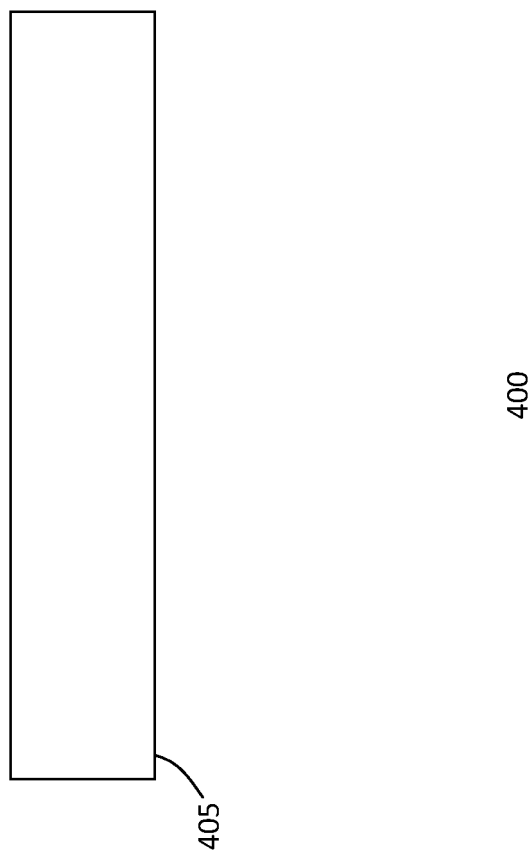

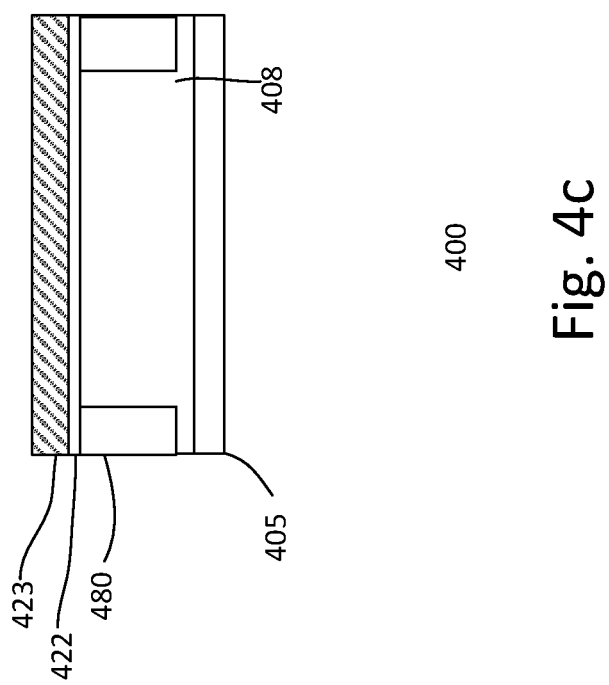

VOLTAGE-TUNABLE MAGNETIC DEVICES FOR COMMUNICATION APPLICATIONS

CROSS-REFERENCE TO RELATED APPLICATIONS

This application claims the benefit of U.S. Provisional Application Ser. No. 62/135,655, filed on Mar. 19, 2015, the disclosure of which is herein incorporated by reference in its entirety for all purposes.

BACKGROUND

Mobile devices, such as mobile phones, require radio frequency (RF) detectors or antennas to facilitate communication, whether voice or data. Important aspects of RF detectors for mobile devices include effective detection of RF and low power consumption. Effective detection enables maximum utilization of communication bandwidth while low power consumption is desired to extend battery life of mobile devices. However, conventional RF detectors which perform effective RF detection, consumes large amount of power. This undesirably leads to reduced battery life.

From the foregoing discussion, it is desirable to provide RF detectors which efficiently and effectively detect RF in communication applications.

SUMMARY

Embodiments of the present disclosure generally relate to voltage control magnetic devices and methods for forming a voltage control magnetic device. In one embodiment, a magnetic device is disclosed. The magnetic device includes a MTJ element. The MTJ element has first and second MTJ terminals which include first and second electrodes. The MTJ element includes a free layer, a fixed layer and a tunnel barrier sandwiched between the fixed and free layers. The free layer, the tunnel barrier and the free layer are disposed between the first and second terminals. The free layer includes a natural precessional frequency which undergoes Rabi oscillation in the presence of a radio frequency (RF) matching the natural processional frequency. A strain induced magnetoelectric (SIM) unit contacts one of the electrodes proximate to the free layer of the MTJ element while a digital line is coupled to the SIM unit. A desired voltage is provided on the digital line to cause the SIM unit to produce a desired strain on the electrode proximate to the free layer to tune the precessional frequency of the free layer to a desired precessional frequency for detecting a desired RF by the magnetic device. The desired RF causes a change in current through the MTJ element due to Rabi oscillation.

In another embodiment, a method of forming a magnetic device is disclosed. The method includes providing a substrate defined with a device region. A selector unit is formed on the substrate. Forming the selector unit includes forming a select transistor. A lower back-end dielectric layer is formed. The lower back-end dielectric layer includes one or more interlevel dielectric (ILD) levels. A bottom electrode is formed on the lower back-end dielectric layer. A MTJ element is formed on the bottom electrode. The MTJ element includes a fixed layer, a tunnel barrier layer and a free layer. The free layer is separated from the free layer by the tunnel barrier. The free layer includes a natural precessional frequency which undergoes Rabi oscillation in the presence of a radio frequency (RF) matching the natural precessional frequency. A top electrode layer is formed over the MTJ element. A stress induced layer is formed. The stress induced layer is disposed on one of the top or bottom electrode which is proximate to the free layer. A digital line is coupled to the stress induced layer. The digital line is configured to provide a desired voltage to cause the stress induced layer to produce a desired strain on the electrode proximate to the free layer to tune the precessional frequency of the free layer to a desired precessional frequency for detecting a desired RF by the magnetic device. The desired radio frequency causes a change in current through the MTJ element due to Rabi oscillation.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 1a-1d show diagrams of parallel and anti-parallel states of magnetic tunneling junction (MTJ) elements;

DETAILED DESCRIPTION

Embodiments of the present disclosure generally relate to RF detectors used in communication applications, such as mobile devices. The RF detectors employ magnetic tunnel junction elements to efficiently and effectively detect RF. The RF detectors as presented in this disclosure are relatively compact and energy efficient due to low switching current required for detection. The RF detectors can be incorporated into or used with, for example, electronic products such as mobile phones as well as other communication devices.

Figure 1B:
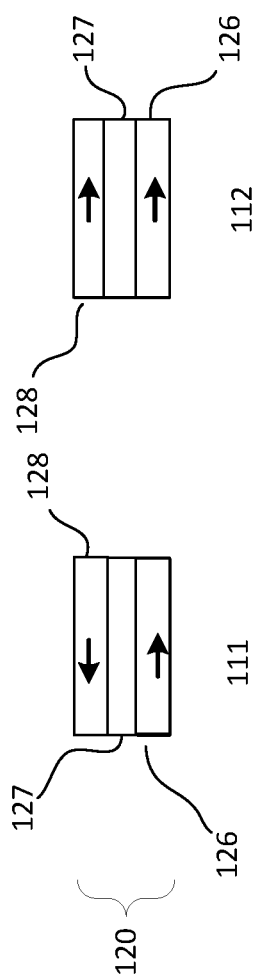

FIG. 1a shows a simplified cross-sectional view of an embodiment of a magnetic tunnel junction (MTJ) element 110. As shown, the magnetization or magnetic orientations of the MTJ element are configured to be in a horizontal/in-plane direction. Horizontal/in-plane direction, for example, refers to a direction along or parallel to a substrate surface. The MTJ element is an MTJ stack 120 which includes a magnetically fixed layer 126, a tunneling barrier layer 127 and a magnetically free layer 128. The magnetic orientation of the fixed layer is fixed while the magnetic orientation of the free layer may be programmed to be in a first or same direction as the fixed layer or in a second or opposite direction as the fixed layer. As shown, the MTJ element has the fixed layer disposed above the free layer, forming a top pinned in-plane MTJ (iMTJ) element. Providing an iMTJ element having the fixed layer disposed below the free layer, as shown in FIG. 1b, to form a bottom pinned iMTJ element may also be useful.

For example, as shown by structure 111, the magnetic direction of the free layer is programmed to be in the first or anti-parallel direction as the fixed layer. The corresponding MTJ electrical resistance between the free layer 126 and the fixed layer 128 is denoted as $R_{AP}$. Structure 112 illustrates that the magnetization of the free layer is programmed to be in a second or parallel direction as the fixed layer. The corresponding MTJ electrical resistance between the free layer 126 and the fixed layer 128 is denoted as $R_P$. The resistance $R_{AP}$ is higher than the resistance $R_P$.

Figure 1D:
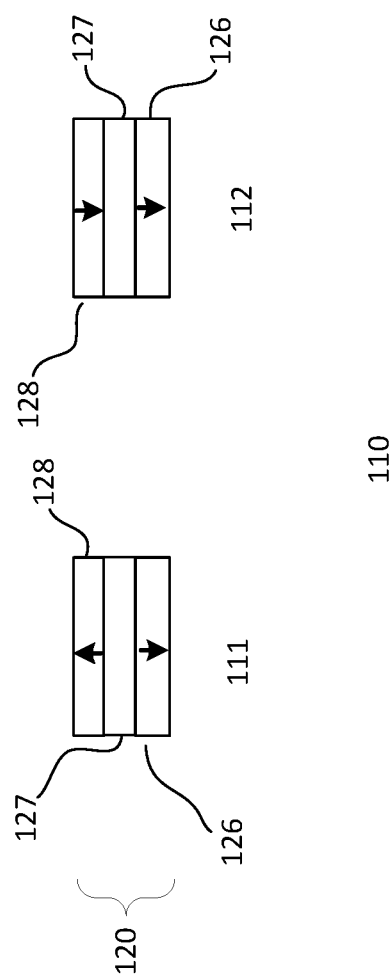

FIG. 1c shows another simplified cross-sectional view of an embodiment of a MTJ element 110 with magnetic orientations in a vertical/perpendicular direction. Vertical/perpendicular direction, for example, refers to a direction perpendicular to a substrate surface. As shown in FIG. 1c, the MTJ element 110 includes a MTJ stack 120 with a fixed layer 126, a tunneling barrier layer 127 and a free layer 128. The magnetic orientation of the fixed layer is fixed while the magnetic orientation of the free layer may be programmed to be in a first or same direction as the fixed layer or in a second or opposite direction as the fixed layer. As shown, the MTJ element has the fixed layer disposed above the free layer, forming a top pinned perpendicular MTJ (pMTJ) element. Providing a pMTJ element having the fixed layer disposed below the free layer, as shown in FIG. 1d, to form a bottom pinned pMTJ element may also be useful.

The corresponding MTJ electrical resistance between the free layer 126 and the fixed layer 128 is denoted as $R_{AP}$. When the MTJ element 110 is in a magnetic parallel state, magnetic orientations of the free layer 126 and the fixed layer 128 are in the same directions as shown by structure 112. The corresponding MTJ electrical resistance between the free layer 126 and the fixed layer 128 is denoted as $R_P$. The resistance $R_{AP}$ is higher than the resistance $R_P$.

The MTJ elements 110 in FIGS. 1a-1d, as described, are simplified descriptions. An actual MTJ element may include other layers. For example, the MTJ element may be disposed between top and bottom electrodes and may include a capping layer between the stack and top electrode. In addition, the fixed layer may include hard layer which is separated from a reference layer by a spacer or texture breaking layer. The hard layer may include first and second synthetic antiferromagnetic (SAF) layers which are separated by a coupling layer, such as Ru. The magnetization of the SAF layers are configured in antiparallel directions. The hard layer serves to pin the reference layer. For example, magnetic coupling between the reference layer and the second or top SAF layer pins the magnetization direction of the reference layer. In additional a seed layer may be provided on the bottom electrode to facilitate forming the hard layer.

By way of example, the free layer and the reference layer may be CoFeB or CoFe based composite material and the tunneling barrier layer may be MgO or $Al_2O_3$. The SAF layers, they may be PtMn, IrMn or multilayers of Co/Pt or Co/Ni while the spacer layer may be Ta. As for the top and bottom electrodes, they may be Ti, TiN, TaN or Ta. Other suitable materials for the MTJ element may also be useful. The MTJ element may include other layers as well. Other suitable configurations of MTJ element or stack may also be useful. A description of MTJ elements may be found in, for example, *Materials Today Journal, Volume 9, Issue* 11, pages 36-45 (November 2006), which is herein incorporated by reference for all purposes. The various layers of the MTJ stack may be formed by, for example, physical vapor deposition. Other deposition techniques, such as sputtering, may also be useful.

Figure 2A:
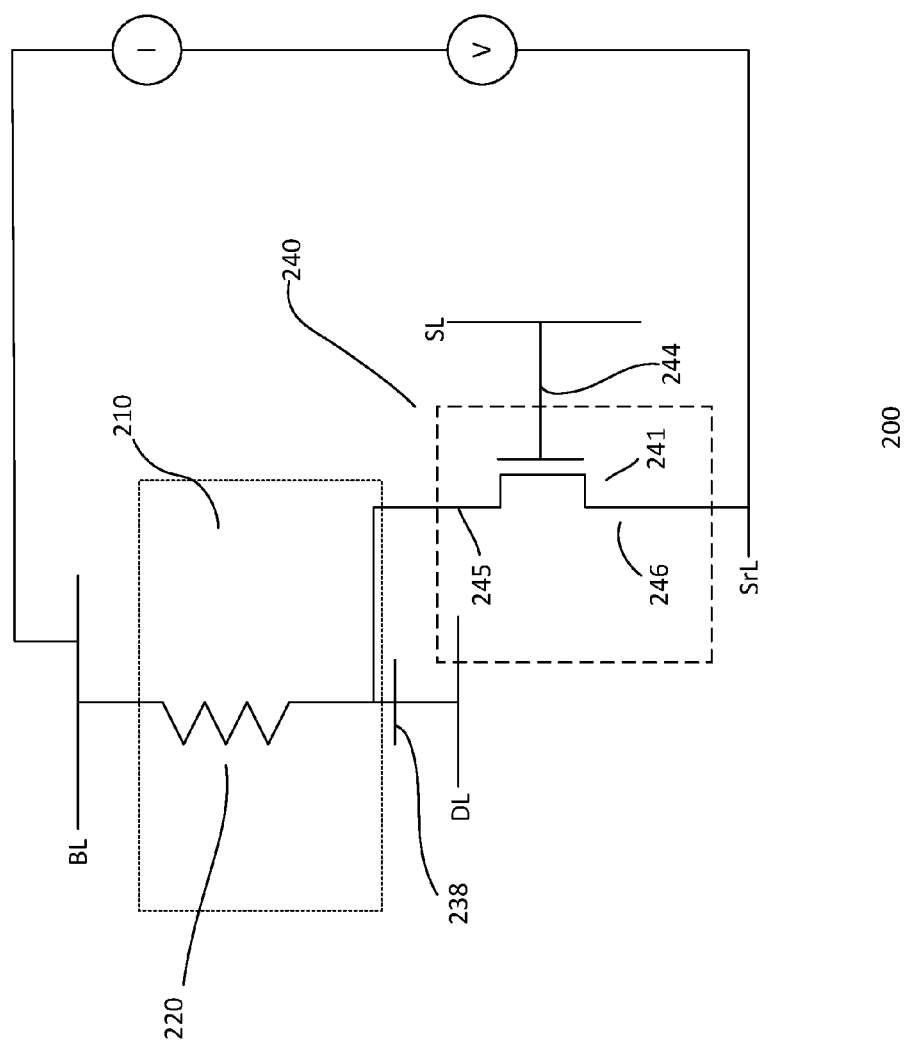
FIGS. 2a-2b show schematic diagrams of embodiments of voltage control magnetic devices.
Figure 2B:
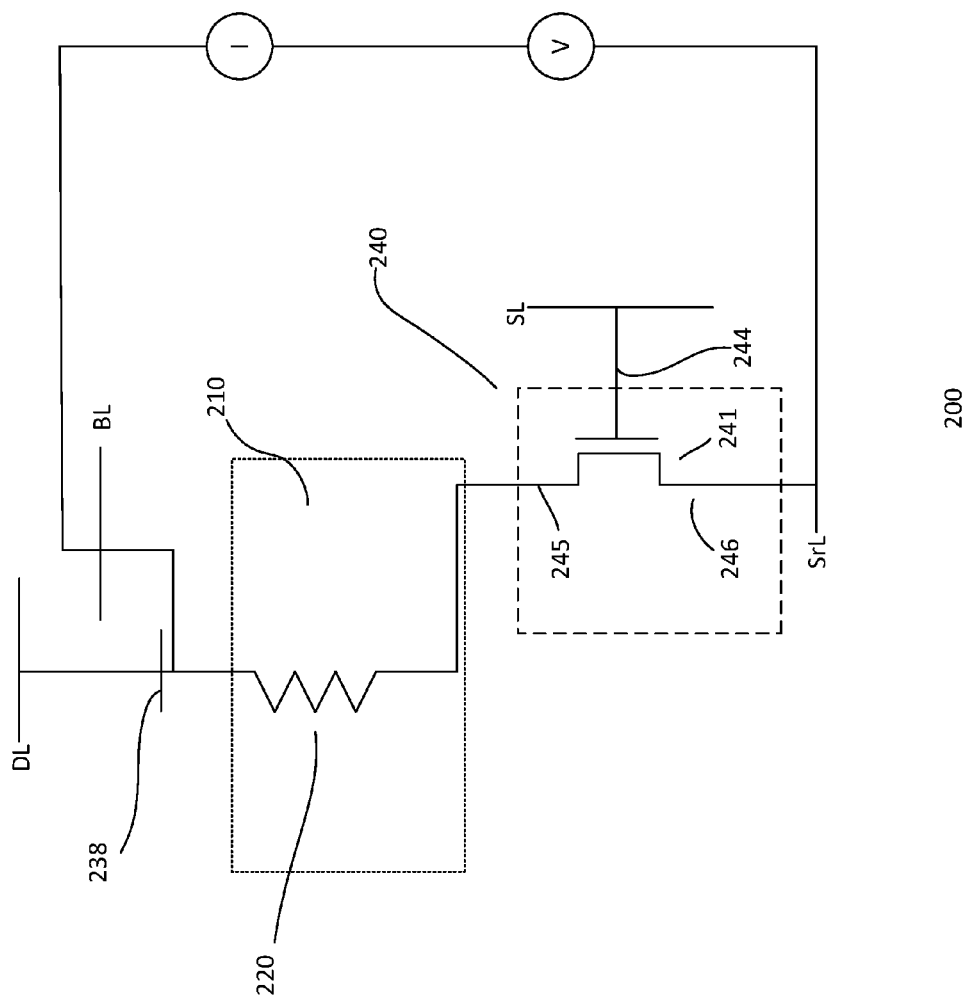

FIGS. 2a-2b show schematic diagrams of embodiments of RF detectors 200. In one embodiment, the RF detector is a voltage control magnetic device. The voltage control magnetic device 200 includes a magnetic based detector unit 210 and a selector unit 240. The magnetic based detector unit 210 is coupled to the selector unit 240. The magnetic based detector unit 210, in one embodiment, includes a MTJ element 220. The MTJ element may be disposed between first and second electrodes. The electrodes, for example, serve as first and second terminals of the MTJ element. The MTJ element may include MTJ elements such as those described in FIGS. 1a-1d. For example, the MTJ element may be a top pinned or bottom pinned iMTJ element or a top pinned or bottom pinned pMTJ element. Other suitable types of magnetic based detector elements may also be useful.

As shown, one terminal of the MTJ element 220 is coupled to a bitline BL while the other terminal of the MTJ element is coupled to the selector unit 240. For example, the first terminal is coupled to the selector unit while the second terminal is coupled to BL. As for the selector unit 240, it includes a select transistor 241. The select transistor 241 is, for example, a metal oxide semiconductor (MOS) transistor. In one embodiment, the select transistor is an n-type MOS transistor. Providing a p-type MOS transistor as a select transistor may also be useful. Other types of transistors or selectors may also be useful. The select transistor 241 includes first and second source/drain (S/D) terminals 245 and 246, and a gate or control terminal 244.

The S/D terminals are formed by, for example, heavily doped regions having the same polarity type dopants as the transistor type. For example, the S/D terminals are heavily n-doped regions for an n-type transistor. The first S/D terminals 245 may be referred to as a drain terminal and the second S/D terminal 246 may be referred to as a source terminal. The drain terminal 245 of the select transistor 241 is coupled to, for example, the first terminal of the MTJ element. The source terminal 246 of the select transistor 241 is coupled to a source line SrL whereas the gate or control terminal 244 is coupled to a select line SL. A current detector I and a voltage source V are connected in series between the SrL and BL.

The RF detector includes a strain induced magnetoelectric (SIM) unit 238. The SIM unit, in one embodiment, is coupled to a terminal of the MTJ element. In one embodiment, the SIM unit is coupled to the first terminal, as shown in FIG. 2a. For example, the SIM unit is coupled to the opposite terminal as the BL. Providing the SIM unit coupled to the second terminal of the MTJ element may also be useful, as shown in FIG. 2b. For example, the SIM unit is coupled to the same terminal as BL.

In one embodiment, the free layer of the MTJ element 220 is configured to be proximate to the terminal with the SIM unit. For example, the free layer or the MTJ element is located closer to the SIM unit than the fixed layer. In the case that the SIM unit is coupled to the first terminal of the MTJ element, the free layer is proximate to the first electrode, as shown in FIG. 2a. In the case that the SIM unit is coupled to the second terminal of the MTJ element, the free layer is proximate to the second electrode, as shown in FIG. 2b.

The SIM unit, in one embodiment, includes a strain induced layer. The strain induced layer has a footprint which accommodates the MTJ element. For example, the strain induced layer has a larger footprint than the free layer of the MTJ element. The strain induced layer may be separated from the free layer by the electrode proximate to the free layer. A digital line (DL) is coupled to the strain induced layer. An electric field is generated when a voltage is applied to the DL. The electric field causes the strain induced layer to apply a strain on the electrode proximate to the free layer. The strain induced layer applies a strain on the free layer when a voltage is applied to the DL. The magnitude of the strain can be controlled by the magnitude of the voltage applied to the DL.

The free layer has a natural precessional frequency. The natural precessional frequency may depend on the free layer design. For example, the free layer may be designed with a specific natural precessional frequency. When an external RF matches the precessional frequency of the free layer, the magnetization of the free layer switches direction induced by Rabi oscillation. The change in magnetization direction of the free layer induced by Rabi oscillation causes a change in current. This change in current can be detected by the current detector coupled to, for example, the bitline. The voltage source, for example, provides current to the MTJ element, enabling the current detector to detect the change in current. As such, a specific RF signal matching the precessional frequency of the free layer can be detected by the RF detector.

In one embodiment, the natural precessional frequency of the free layer is tuned by adjusting the strain applied to the electrode coupled to the MTJ element. For example, the voltage on the DL can be adjusted to achieve the desired strain, which results in the free layer having a desired precessional frequency. Tuning the precessional frequency of the free layer enables detection of a specific desired RF frequency.

In one embodiment, a sweeping voltage is provided at DL. The sweeping voltage, for example, sweeps between low and high values to forming a sweeping range. For example, the sweep range may be from 0 V-1 V. Other sweep ranges may also be useful. The sweeping voltage changes the precessional frequency of the free layer. When a particular precessional frequency matches an incoming RF signal, Rabi oscillation is induced. This causes a change in current as the free layer rotates.

Table 1 below shows exemplary signals or bias conditions applied to the RF detector for a detect operation.

TABLE 1

| Operation | Signal (V) | | | |
|---|---|---|---|---|
| | SrL | SL | BL | DL |
| Detect | 0 V | 1.1 V | 0.2 V | 0-1 V sweep |
| Non-detect | 0 V | 0 V | 0 V | 0 V |

The bias conditions or voltages in the Table 1 above are for a RF detector with a n-type select transistors. The voltages are exemplary and may change depending on, for example, the technology node, top or bottom pinned MTJ, as well as the type of select transistors. The sweep range on DL can vary depending on the desired precessional frequency or RF to be detected.

Figure 3A:
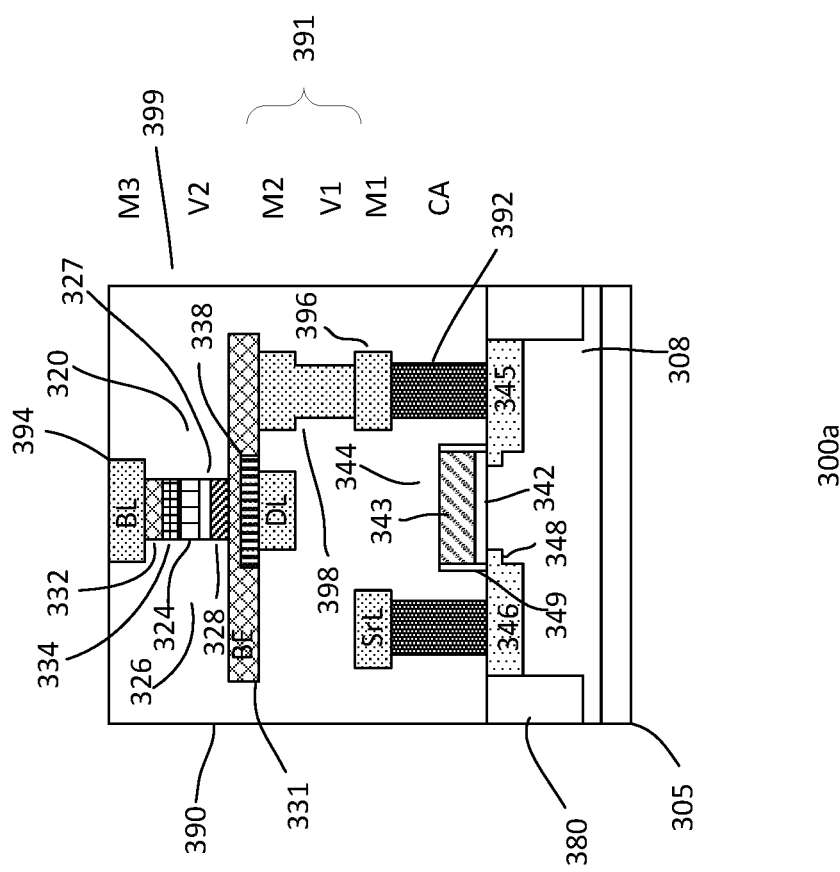
FIGS. 3a-3b show cross-sectional views of embodiments of voltage control magnetic devices.

FIG. 3a shows a cross-sectional view of an embodiment of a voltage control magnetic device 300a. The voltage control magnetic device is similar to the voltage control magnetic device 200 described in FIG. 2a. Common elements may not be described or described in detail.

The voltage control magnetic device serves as a RF detector. The voltage control magnetic device is disposed on a substrate 305. For example, the voltage control magnetic device is disposed in a device region of the substrate. The device region may be part of a detector region having other RF detectors or magnetic devices. The substrate may include other types of device regions (not shown), such as high voltage (HV) as well as logic regions, including low voltage (LV) and intermediate voltage (IV) device regions. Other types of regions may also be provided.

The substrate, for example, is a semiconductor substrate, such as a silicon substrate. For example, the substrate may be a lightly doped p-type substrate. Providing intrinsic or other types of doped substrates, such as silicon germanium (SiGe), germanium (Ge), gallium arsenide (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, includes silicon oxide, which provides a buried oxide (BOX) layer. The surface and bulk crystalline layers, for example, are single crystalline silicon. In such case, the COI substrate, for example, is a silicon-on-insulator (SOI) substrate. Other types of dielectric insulating materials and crystalline layers to form other types of COI substrates may also be useful. It is understood that the surface and bulk layers need not be formed of the same material.

Isolation regions 380 may be provided. In one embodiment, the isolation regions are shallow trench isolation (STI) regions. Other suitable types of isolation regions may also be useful. The isolation regions are provided to isolate device regions from other regions. In one embodiment, isolation regions may be provided to isolate voltage control magnetic devices from each other. For example, a voltage control magnetic device may be formed in a device region which is isolated from other device regions by isolation regions. Other suitable configurations of isolation regions may also be useful.

A selector unit is provided in the device region. The selector unit includes a select transistor and may be a metal oxide semiconductor (MOS) transistor. In one embodiment, the MOS transistors are n-type MOS transistors. Other types of selectors may also be useful. The device region includes a device well or body well 308 for the select transistor. The device well 308 may be a continuous well and may be doped with second polarity type dopants for first polarity type select transistors. The body well, in one embodiment, is a p-type doped well for n-type transistors. The device well may be lightly or intermediately doped with second polarity type dopants. For example, the device well may have a dopant concentration of about 1E16 to 1E19/cm$^3$. Other suitable dopant concentrations may also be useful.

The select transistor, as shown, includes first and second S/D regions 345 and 346 with a gate 344 disposed on the substrate between them. The first S/D region may be referred to as a drain region 345 while the second S/D region may be referred to as a source region 346. The gate of the select transistor includes a gate electrode 343 over a gate dielectric 342. The gate electrode may be polysilicon while the gate dielectric may be silicon oxide. Other suitable types of gate electrode and gate dielectric materials may also be useful. A gate, for example, may be a gate conductor along a select line SL direction. The gate conductor may serve as a select line SL.

As for the S/D regions, they are heavily doped regions with first polarity type dopants. For example, the S/D regions are heavily doped n-type regions for forming n-type transistors. Providing S/D regions with p-type dopants for p-type transistors may also be useful. The S/D regions may include lightly doped (LD) extension regions 348. The gate may include dielectric sidewall spacers 349. The spacers, for example, facilitate in forming the lightly doped (LD) extension regions and heavily doped S/D regions. The LD extension regions, for example, are lightly doped regions extending slightly under the gate.

Disposed over the select transistor is a dielectric layer 390. The dielectric layer serves as a backend dielectric layer. The backend dielectric layer may include one or more interlevel dielectric (ILD) layers 391. The ILD layer 391 includes a metal level and a contact level. The metal level includes conductors or metal lines while the contact level includes contacts. The conductors and contacts may be formed of a metal, such as copper, copper alloy, aluminum, tungsten or a combination thereof. Other suitable types of metals, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE), may also be employed to form metal lines.

As discussed, the backend dielectric layer may include a plurality of ILD levels. For example, x number of ILD levels may be provided. A metal level of an ILD level may be referred to as $M_i$, where i is the $i^{th}$ ILD level of x ILD levels. A contact level of an ILD level may be referred to as $V_{i-1}$, where i is the $i^{th}$ ILD level of x ILD levels. As shown, the dielectric layer includes ILD levels up to M3. The dielectric layer may include additional ILD levels (not shown). The number of levels may depend on design requirements.

For the first contact level, it may be referred to as a CA or a pre-metal dielectric (PMD) level. The first metal level may be referred to as M1. For the first ILD level, contacts and metal lines may be formed by separate single damascene processes. Contacts in the PMD level may be tungsten contacts while conductors or metal lines in M1 may be formed of copper or copper alloy. For upper ILD levels, metal lines and contacts may be formed by dual damascene techniques. Dual damascene processes may employ copper or copper alloys for contacts and conductive lines. Other configurations or techniques for forming lines and contacts of the ILD levels may also be useful.

As shown, contacts 392 are disposed in the CA level of the backend dielectric layer. The contacts, for example, are in communication with contact regions on the substrate. For example, the contacts may be coupled to the S/D regions and gate. Conductive lines are disposed in the first metal or M1 level above the CA level. In one embodiment, the SrL is coupled to the source region 346 of the select transistor. The SrL is connected to the source region 346 via contact 392 in the CA level. In addition, an interconnect pad 396 is disposed in M1.

In one embodiment, an interconnect pad and contact is provided in M2 and V1. The interconnect pad and contact may be formed using a dual damascene technique, forming a pad-contact unit 398. Forming the pad-contact using other techniques may also be useful. The pad-contact unit is coupled to the interconnect pad on M1. In one embodiment, a digital line DL is disposed in M2. The DL may be parallel to the gate or SrL.

A MTJ dielectric (MTJD) layer 399 is disposed in the dielectric layer 390. The MTJD layer, for example, is part of the V2 level. Providing the MTJD dielectric layer in other levels may also be useful. The MTJD layer accommodates a magnetic element 320, such as a MTJ element. In one embodiment, the MTJ element is a top pinned MTJ element, such as a top pinned iMTJ or top pinned pMTJ element as described in FIGS. 1a and 1c.

As shown, the top pinned MTJ unit includes a MTJ element disposed between bottom and top electrodes 331 and 332. The MTJ element, in one embodiment, includes a free layer 328, a tunneling barrier layer 327, a reference layer 324 and a SAF layer 334 disposed between bottom and top electrodes 331 and 332. The SAF and reference layers, for example, form a fixed layer 326. The free layer, as shown, is above the bottom electrode BE. Other types or configurations of MTJ elements, including other types of layers or materials may also be useful.

A SIM unit 338 is disposed on the MTJ layer. In one embodiment, the SIM unit is a strain induced layer disposed in the MTJD layer. The strain induced layer is coupled to the DL. For example, the strain induced layer is disposed in the MTJD layer over the DL. In one embodiment, the strain induced layer 338 includes a strain induced material. Various types of strain induced material may also be useful. For example, the strain induced material may include a piezo electric or a ferroelectric material, such as aluminum nitride (AlN), lead zirconate titanate (PZT), $BaTiO_3$ or $BiFeO_3$. Other types of strain induced materials may also be useful. The thickness of the strain induced layer may be about, for example, 2-20 nm or more. Other suitable thicknesses may also be useful.

The BE 331 of the MTJ is disposed in the MTJD layer over the strain induced layer 338 disposed in the bottom electrode layer 331 of the MTJ element. As shown, BE is an extended BE. The extended BE covers the strain induced layer 338 and is coupled to the pad-contact unit 398. The various other layers of the MTJ element, such as free layer 328, tunneling barrier layer 327, fixed layer 328 and top electrode 332 are disposed over the BE 331. As discussed, the strain induced layer has a larger footprint then the free layer, as well as the layers above, of the MTJ element.

Above the MTJD layer may be a metal level. For example, the metal level is M3. Other metal levels may also be useful. The metal level includes metal lines 394 disposed in a dielectric layer. The metal lines and top of the dielectric layer have coplanar top surfaces. In one embodiment, a BL is provided in the metal level above the MTJD layer and is coupled to the top electrode layer 332 of the MTJ element.

Although as described, the various lines and MTJ element are disposed in specified dielectric levels of the backend dielectric layer, other configurations may also be useful. For example, they may be disposed in other or additional ILD levels. For example, the MTJ element may be provided in via level of other metal levels, such as between M3 and M4 or other suitable upper metal levels.

Figure 3B:
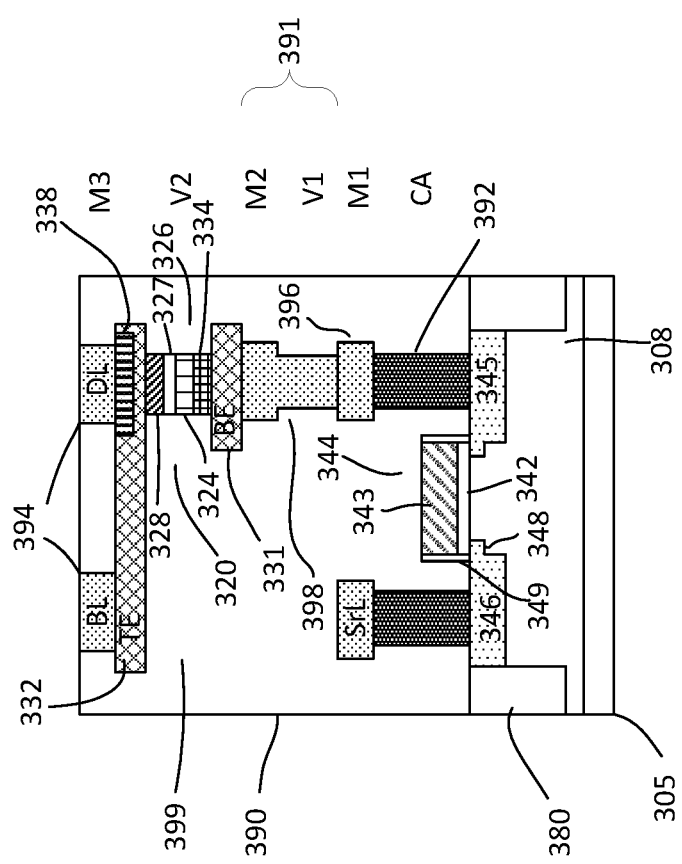

FIG. 3b shows another embodiment of a voltage control magnetic device 300b. The voltage control magnetic device is similar to the voltage control magnetic device described in FIG. 2b and FIG. 3a. Common elements may not be described or described in detail.

The voltage control magnetic device serves as a RF detector. The voltage control magnetic device is disposed on a substrate 305. The substrate may include other types of device regions (not shown). Isolation regions 380, such as STI regions, may be provided. The isolation regions are provided to isolate device regions from other regions.

A selector unit is provided in the device region. The selector unit includes a select transistor and may be a metal oxide semiconductor (MOS) transistor. Other types of selectors may also be useful. The device region includes a device well or body well 308 for the select transistor. The select transistor, as shown, includes first and second S/D regions 345 and 346 with a gate 344 disposed on the substrate between them. The first S/D region may be referred to as a drain region 345 while the second S/D region may be referred to as a source region 346. The gate may include dielectric sidewall spacers 349. A source line (SrL) is provided in M1 and is coupled to the source via the source contact. An interconnect pad 396 is provided in M1 and is coupled to the drain contact. In one embodiment, a pad-contact unit 398 is provided in M2 and V1, coupling to the interconnect pad in M1.

A MTJD layer 399 is disposed in the dielectric layer 390. The MTJD layer, for example, is part of the V2 level. Providing the MTJD dielectric layer in other levels may also be useful. The MTJD layer accommodates a magnetic element 320, such as a MTJ element. In one embodiment, the MTJ element is a bottom pinned MTJ element, such as a bottom pinned iMTJ or bottom pinned pMTJ element, as described in FIGS. 1*b* and 1*d*.

As shown, the bottom pinned MTJ unit includes a MTJ element disposed between bottom and top electrodes 331 and 332. The MTJ element, in one embodiment, includes a SAF layer 334, a reference layer 324, a tunneling barrier layer 327, and a free layer 328 disposed between bottom and top electrodes 331 and 332. The SAF and reference layers, for example, form a fixed layer 326. The fixed layer, as shown, is above the bottom electrode BE while the free layer is below the top electrode TE. Other types or configurations of MTJ elements, including other types of layers or materials may also be useful.

In one embodiment, the BE is disposed on the pad-contact unit. The bottom pinned MTJ element 320 or stack is disposed on the BE. On top of the MTJ stack is the TE. The TE, in one embodiment, is an extended TE. The extended TE is sufficient to accommodate a SIM unit 338 and BL. In one embodiment, the SIM unit includes a stress induced layer. The stress induced layer, as shown, has a coplanar top surface with the top of the TE. Other configurations of stress induced layer and TE may also be useful. For example, the stress induced layer may be disposed on TE, resulting in non-coplanar top surfaces between the TE and stress induced layer.

A metal level dielectric layer is disposed over the MTJD layer. For example, M3 is disposed over the MTJD layer. Other metal levels may also be useful. The metal level includes metal lines 394 disposed in a dielectric layer. The metal lines and top of the dielectric layer have coplanar top surfaces. In one embodiment, the BL and DL are provided in the metal level above the MTJD layer. The DL is coupled to the stress induced layer and the BL is coupled to the TE. The DL may also be coupled to the TE.

As described, the MTJ unit is a bottom pinned MTJ unit. As such, the SIM unit is disposed on the TE. The DL is disposed above the SIM unit which is above the MTJ stack.

Figure 4B:
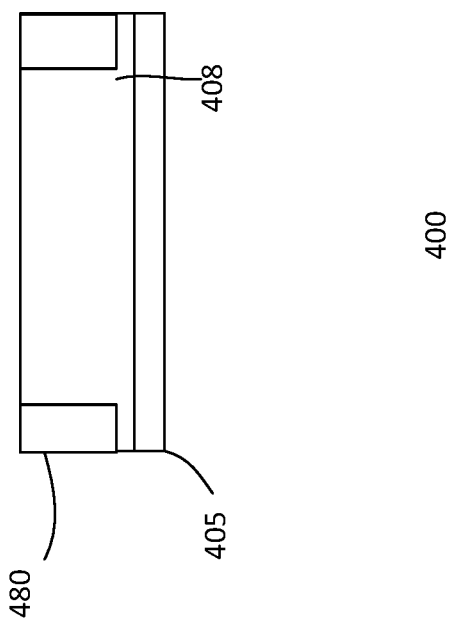
FIGS. 4a-4r show cross-sectional views of an embodiment of a process for forming a voltage control magnetic device.
Figure 4D:
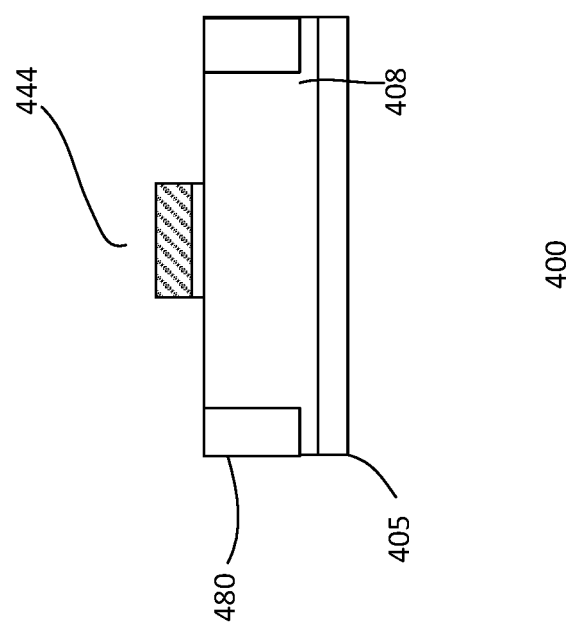
Figure 4E:
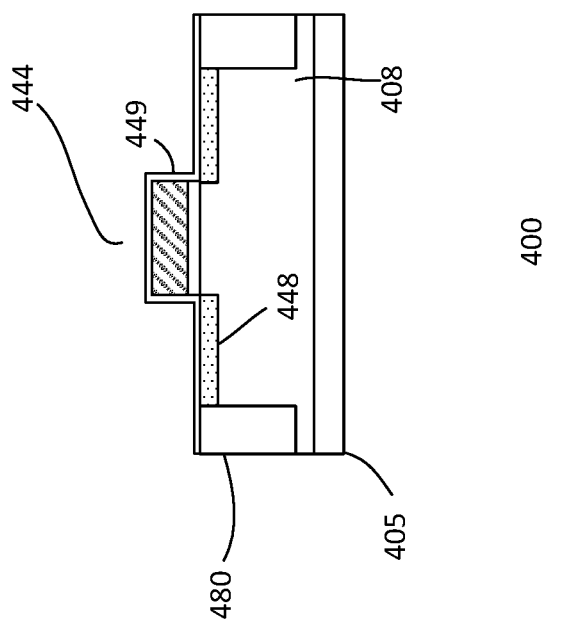
Figure 4F:
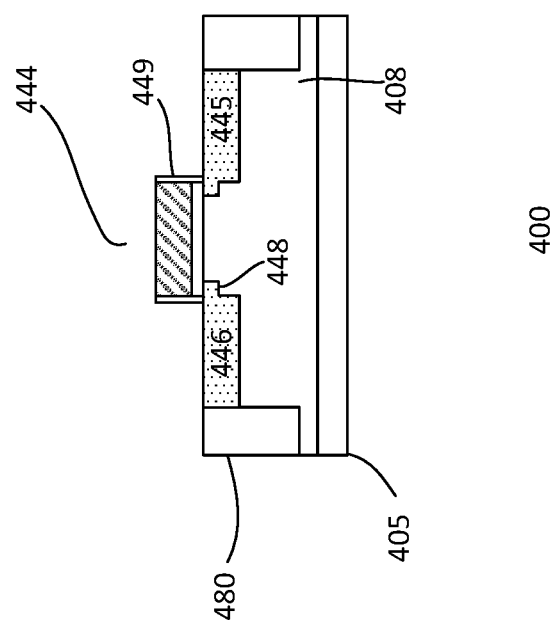
Figure 4G:
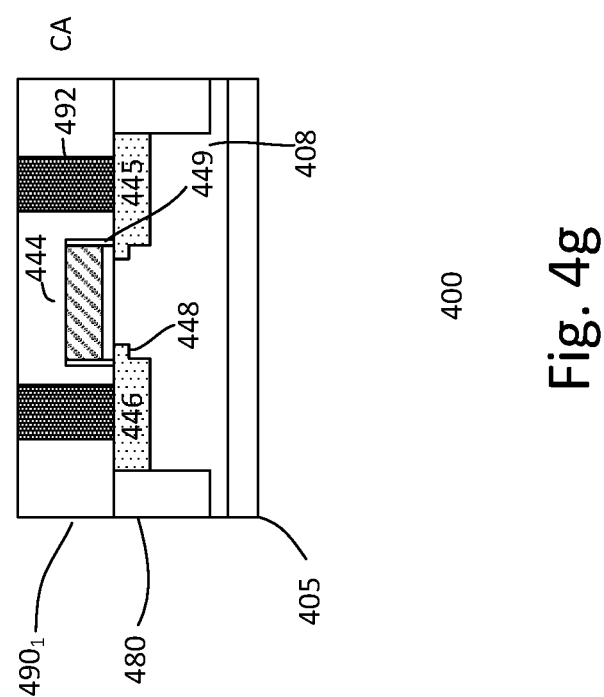
Figure 4H:
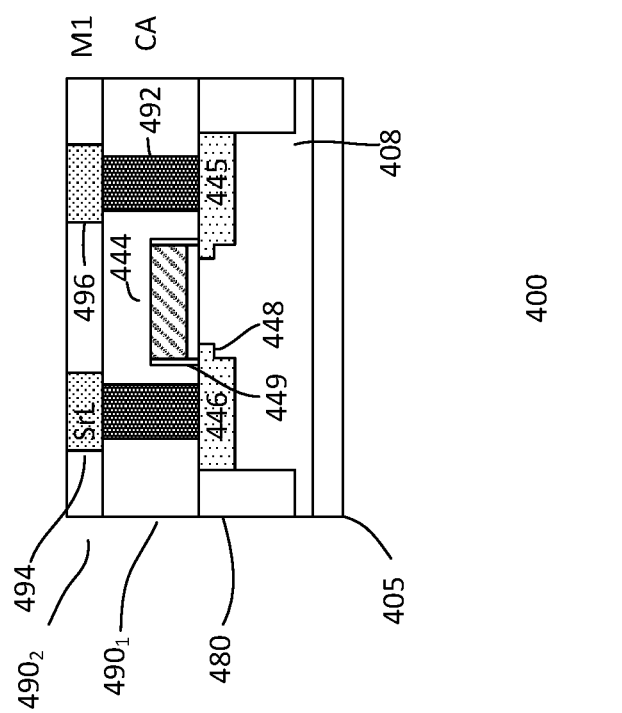
Figure 4I:
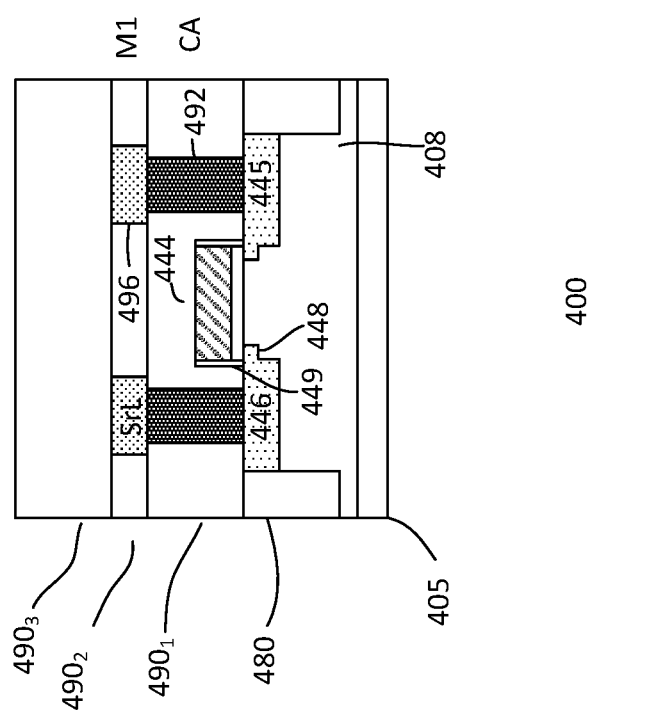
Figure 4J:
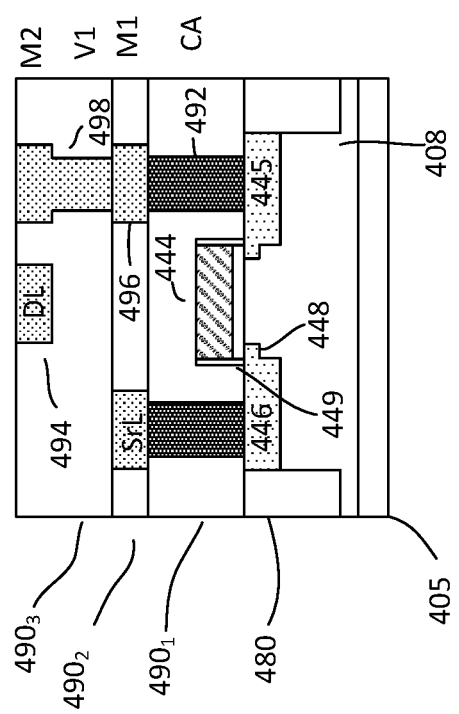
Figure 4K:
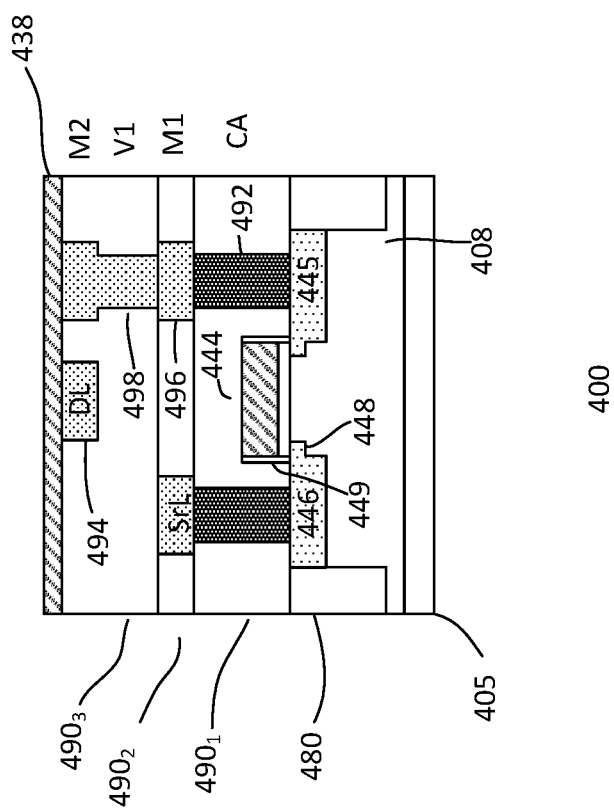
Figure 4I:
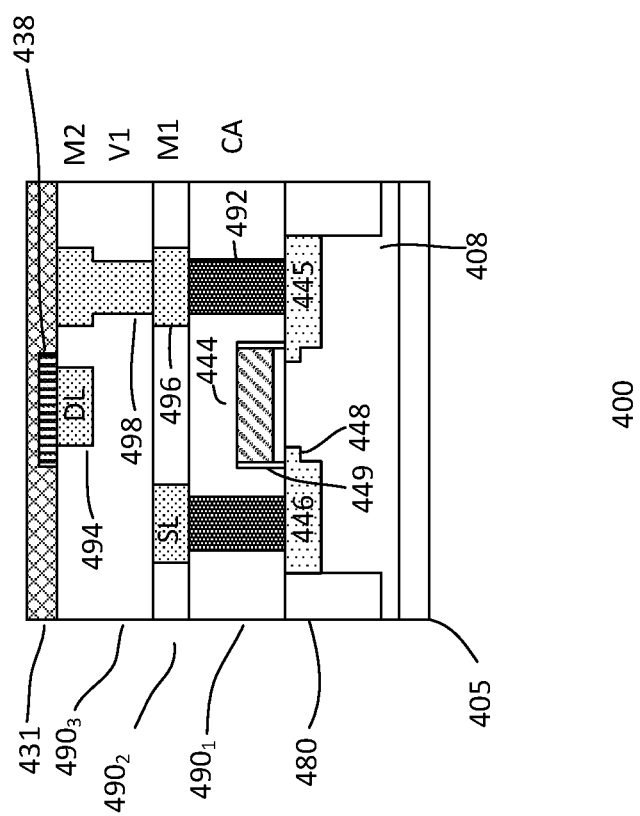
Figure 4M:
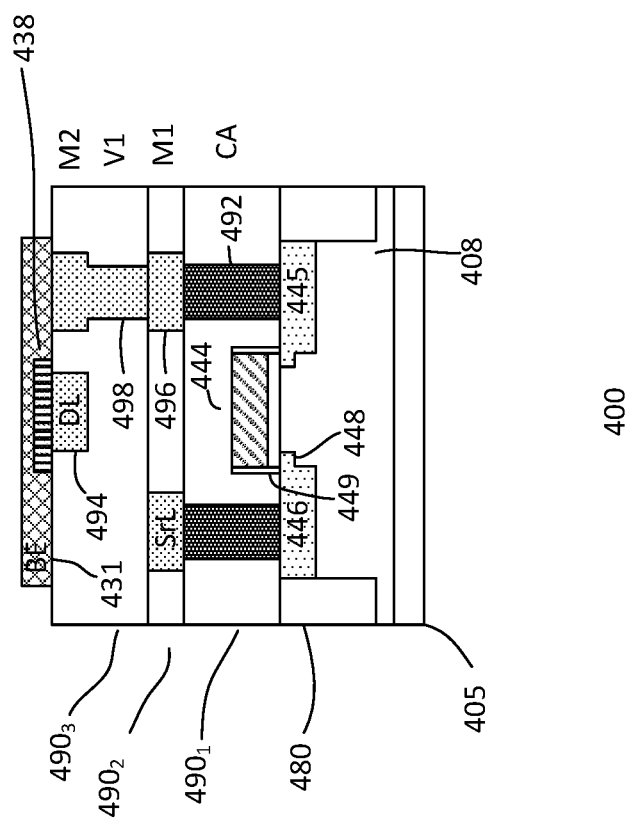
Figure 4N:
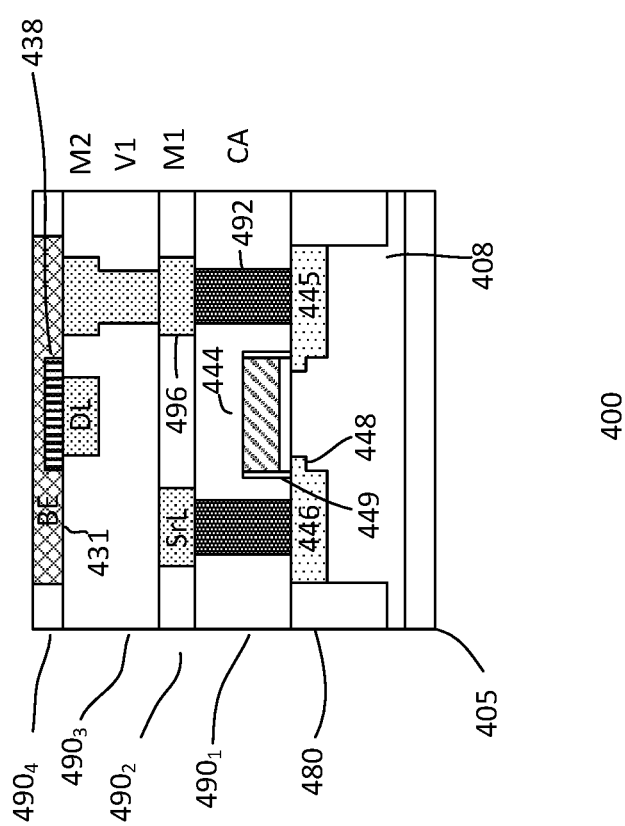
Figure 4O:
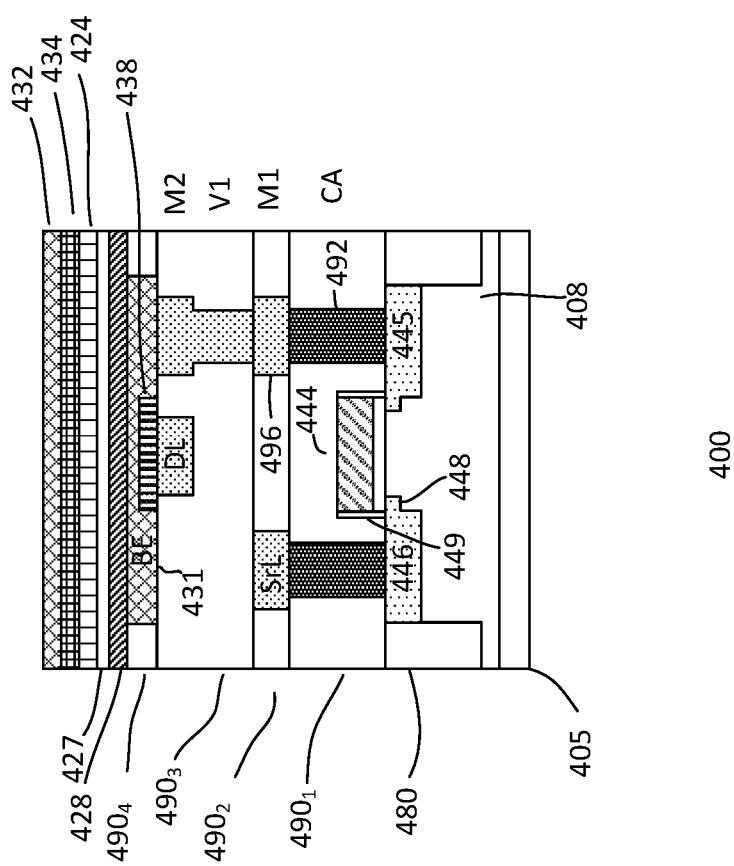
Figure 4P:
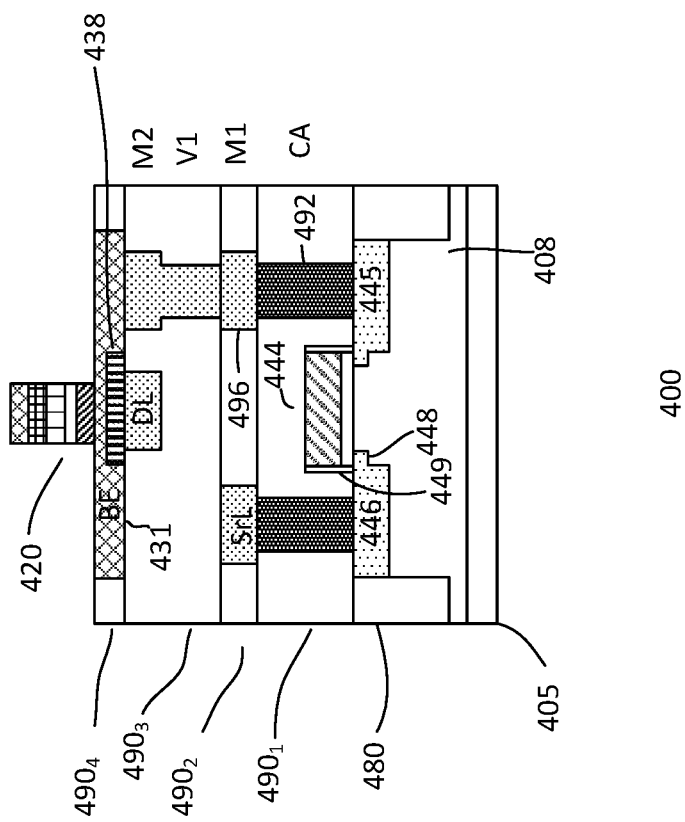
Figure 4Q:
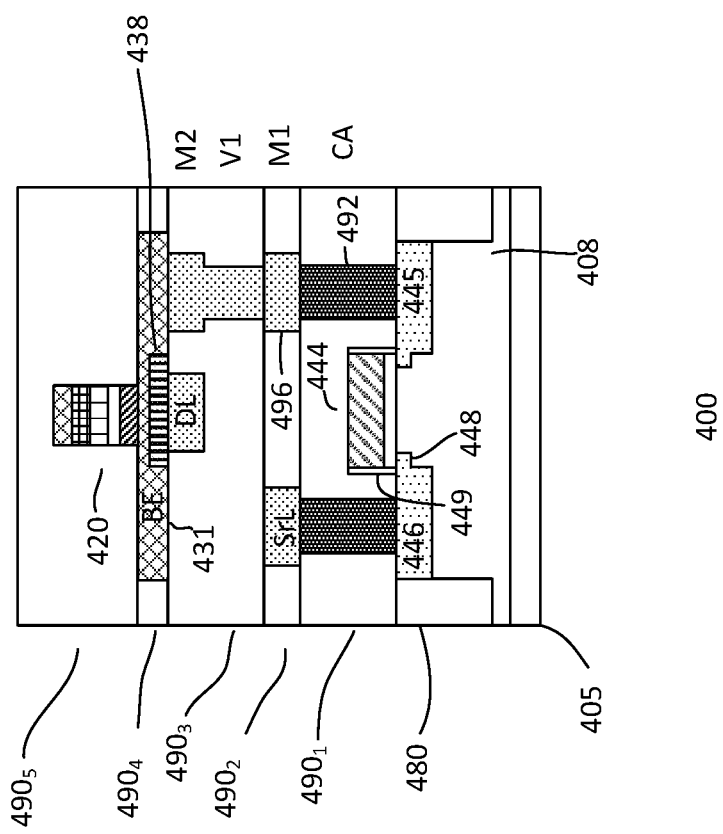
Figure 4R:
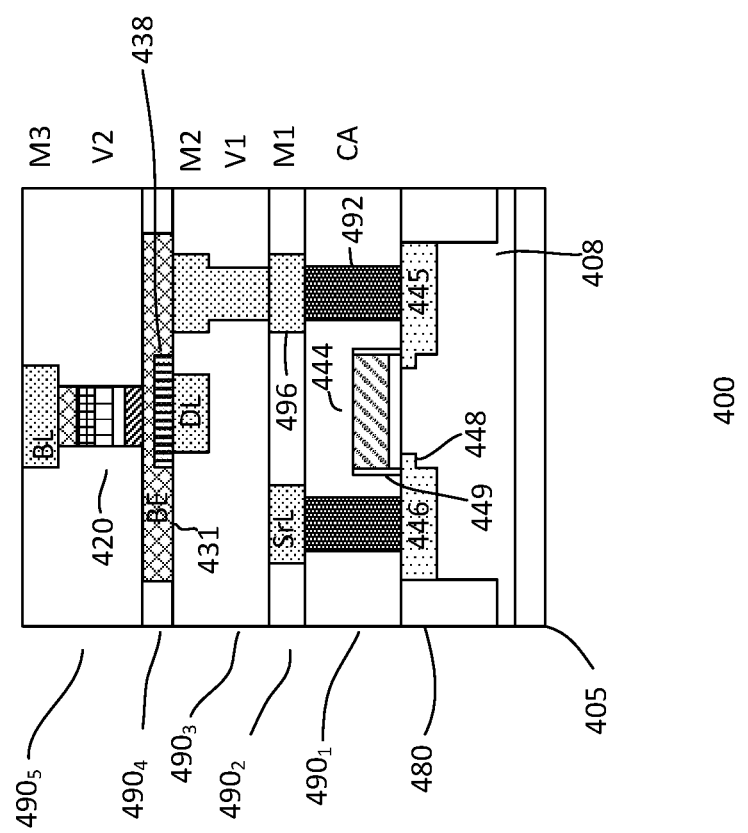

FIGS. 4*a*-4*r* show cross-sectional views of an embodiment of a process 400 for forming a voltage control magnetic device. The voltage control magnetic device, for example, is the same or similar to that described in FIG. 3*a*. Common elements may not be described or described in detail.

Referring to FIG. 4*a*, a substrate 405 is provided. The substrate, for example, is a semiconductor substrate, such as a silicon substrate. For example, the substrate may be a lightly doped p-type substrate. Providing an intrinsic or other types of doped substrates, such as silicon germanium (SiGe), germanium (Ge), gallium arsenide (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, includes silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

As shown in FIG. 4*b*, the substrate is processed to define a device region in which a voltage control magnetic device is formed. An isolation region 480 is formed in the substrate to define the device region. In one embodiment, the isolation region is a shallow trench isolation (STI) region. Other types of isolation regions may also be useful. The isolation region may be formed by, for example, etching trenches in the substrate and filling them with a dielectric material, such as silicon oxide. A planarization process, such as chemical mechanical polish (CMP), is performed to remove excess dielectric material, leaving, for example, STI regions isolating the device regions.

A device well or a body well 408 is formed. The well, for example, serves as a body of a select transistor. In one embodiment, second polarity type dopants are implanted into the substrate to form the device well. The second polarity type dopants, for example, include p-type dopants. In one embodiment, an implant mask may be employed to implant the dopants to form the device well. The implant mask, for example, is a patterned photoresist layer. The implant mask exposes regions of the substrate in which the second polarity wells are formed. The device well may be lightly or intermediately doped with second polarity type dopants. For example, the device well may have a dopant concentration of about 1E16 to 1E19/cm$^3$. Other dopant concentrations may also be useful.

As shown in FIG. 4*c*, gate layers are formed on the substrate. The gate layers, in one embodiment, include a gate dielectric layer 422 and a gate electrode layer 423 over the gate dielectric layer. The gate dielectric layer 422, for example, may be a silicon oxide layer formed by, thermal oxidation. As for the gate electrode layer 423, it may be a polysilicon layer formed by chemical vapor deposition (CVD). Other suitable types of gate layers or other suitable techniques for forming the gate layers may also be useful.

Referring to FIG. 4*d*, the gate layers are patterned to form a gate 444 of a select transistor. Patterning the gate layers may be achieved using mask and etch techniques. For example, a soft mask, such as photoresist may be formed over the gate electrode layer. An exposure source may selectively expose the photoresist layer through a reticle containing the desired pattern. After selectively exposing the photoresist layer, it is developed to form openings corresponding to location where the gate layers are to be removed.

To improve lithographic resolution, an anti-reflective coating (ARC) may be used below the photoresist layer. The patterned mask layer is used to pattern the gate layers. For example, an anisotropic etch, such as reactive ion etch (RIE), is used to remove exposed portions of the gate layers. Other types of etch processes may also be useful. The etch transfers the pattern of the mask layer to the underlying gate layers. The gate, for example, may be a gate conductor along a first or select line direction. The gate conductor may serve as a select line SL.

Referring to FIG. 4e, an implant is performed to form LD extension regions 448. An implant mask (not shown) may be used to form the LD extension regions. To form the LD extension regions 448, first polarity type dopants are implanted into the substrate. The first polarity type dopants, for example, include n-type dopants. In one embodiment, the implant forms LD extension regions 448 in the substrate adjacent to the gate. For example, the LD extension regions extend slightly under the gate. The LD extension regions, for example, include suitable dopant concentration of first polarity type dopants.

The process 400 continues to form sidewall spacers on sidewalls of the gate 444. To form the spacers, a dielectric spacer layer 449, such as silicon oxide, is formed on the substrate covering the gate as shown in FIG. 4e. The spacer layer may be formed by CVD. Other techniques for forming the spacer layer may also be useful. An anisotropic etch, such as RIE, is performed to remove horizontal portions of the spacer layer, leaving spacers 449 to abut the sidewalls of the gate 444 in FIG. 4f.

Referring to FIG. 4f, an implant is performed to form first and second S/D regions 445 and 446 of the select transistor. An implant mask (not shown) may be used to form the first and second S/D regions in the substrate. In one embodiment, the implant forms heavily doped first polarity type S/D regions in the substrate adjacent to the gate. As shown, the implant forms first and second S/D regions 445 and 446 adjacent to the gate 444 of the select transistor. The first S/D region may be referred to as a drain region while the second S/D region may be referred to as a source region.

The first polarity type dopants, for example, include n-type dopants. The implantation process to form the first and second S/D regions may be performed together while forming first polarity type S/D regions in other device regions (not shown) on the same substrate. The first and second heavily doped S/D regions, for example, have a depth deeper than the LD extension regions 448. The first and second S/D regions, for example, include suitable dopant concentration which is greater than dopant concentration of the LD extension regions. A dielectric etch stop liner (not shown) may be formed over the transistor. The etch stop liner, for example, is a nitride etch stop liner. Other types of dielectric etch stop liners may also be useful. The etch stop liner serves as an etch stop for subsequent processes, such as contacts formation.

Referring to FIG. 4g, a dielectric layer $490_1$ is formed on the substrate, covering the select transistor. The dielectric layer, for example, serves as a dielectric layer of an ILD layer. For example, the dielectric layer serves as a PMD or CA level of an ILD layer. The dielectric layer, for example, is a silicon oxide layer. Other types of dielectric layers may also be useful. The dielectric layer may be formed by CVD. Other techniques for forming the dielectric layer may also be useful. A planarizing process may be performed to produce a planar surface. The planarizing process, for example, may include CMP. Other types of planarizing processes may also be useful.

In one embodiment, contacts 492 are formed in the dielectric layer $490_1$ as shown in FIG. 4g. The contacts, for example, connect to contact regions, such as S/D regions and the gate of the transistor. Forming the contacts may include forming contact vias in the dielectric layer to expose the contact regions. As shown, contacts 492 are coupled to the drain region 445 and source region 446 of the transistor. Forming the contact vias may be achieved using mask and etch techniques. After the vias are formed, a conductive material is deposited to fill the vias. The conductive material, for example, may be tungsten. Other types of conductive materials may also be useful. A planarization process, such as CMP, is performed to remove excess conductive material, leaving contact plugs in the contact vias.

In FIG. 4h, a dielectric layer $490_2$ is formed over the substrate, covering the lower dielectric layer $490_1$. The dielectric layer $490_2$, for example, serves as a metal level of an ILD layer. In one embodiment, the dielectric layer $490_2$ serves as M1 level of the ILD layer. The dielectric layer $490_2$, for example, is a silicon oxide layer. Other types of dielectric layers may also be useful. The dielectric layer may be formed by CVD. Other techniques for forming the dielectric layer may also be useful. Since the underlying surface is already planar, a planarizing process may not be needed. However, it is understood that a planarization process, such as CMP, may be performed if desired to produce a planar surface.

Metal lines 494 and/or interconnect pads 496 are formed in the dielectric layer $490_2$. The metal lines or interconnect pads may be formed by damascene technique. For example, the upper dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. In one embodiment, forming the metal lines include forming a source line SrL to connect to the source region 446 of the select transistor and an interconnect pad 496 coupled to the drain region 445 of the transistor.

In FIG. 4i, a dielectric layer $490_3$ is formed over the substrate, covering the lower dielectric layer $490_2$. The dielectric layer $490_3$, for example, serves as contact and metal levels of an ILD layer. In one embodiment, the dielectric layer $490_3$ serves as V1 and M2 level of the ILD layer. The dielectric layer $490_3$, for example, is a silicon oxide layer. Other types of dielectric layers may also be useful. The dielectric layer may be formed by CVD. Other techniques for forming the dielectric layer may also be useful. Since the underlying surface is already planar, a planarizing process may not be needed. However, it is understood that a planarization process, such as CMP, may be performed if desired to produce a planar surface.

Referring to FIG. 4j, an interconnect pad and contact is formed in the dielectric layer $490_3$. The contact is formed in V1 while interconnect pad is formed in M2. The interconnect pad is coupled to the contact, which in turn is coupled to interconnect pad 496 in M1. The contact and interconnect pad may be formed using a dual damascene technique, forming a pad-contact unit 498. A metal line 494 is also formed in the dielectric layer $490_3$ adjacent the interconnect pad. The metal line serves as a digital line DL and is formed, for example, in a parallel direction with the gate or SL.

The process 400 continues to form a strain induced layer 438 over the dielectric layer $490_3$ as shown in FIG. 4k. In one embodiment, the strain induced layer includes a strain induced material. Various types of strain induced material may also be useful. For example, the strain induced material may include a piezo electric or a ferroelectric material, such as aluminum nitride (AlN), lead zirconate titanate (PZT), $BaTiO_3$ or $BiFeO_3$ layer. Other suitable types of strain induced materials may also be useful. The strain induced layer may be formed using suitable techniques, such as PVD. The thickness of the strain induced layer may be about, for example, 2-20 nm and even more. Other suitable thicknesses may also be useful.

Referring to FIG. 4l, the strain induced layer is patterned to form a strain induced layer 438 over the DL. Patterning the strain induced layer may be achieved using an anisotropic etch, such as RIE, with a patterned mask layer. Other techniques for defining the strain induced layer may also be useful. The strain induced layer is coupled to the DL. As discussed, the strain induced layer has a footprint to accommodate a MTJ element. The process continues to form a bottom electrode layer 431 of a MTJ element. A planarizing process, such as CMP, may be employed to provide the bottom electrode layer with a planar top surface. However, it is understood that a planarization process may not be needed.

Referring to FIG. 4m, the bottom electrode layer 431 is patterned to define a bottom electrode layer 431 over the strain induced layer 438. Patterning the bottom electrode layer 431 may be achieved using an anisotropic etch, such as RIE, with a patterned mask layer. Other techniques for defining the bottom electrode layer 431 may also be useful. The bottom electrode layer 431 is patterned to form an extended BE such that the footprint of the bottom electrode layer 431 is sufficient to accommodate a MTJ element 420 thereover and large enough to be in electrical contact with the pad-contact unit 498 in M2 which is coupled to the drain region of the transistor.

As shown in FIG. 4n, a dielectric layer $490_4$ is formed to fill the gaps left by patterning of the bottom electrode layer 431. The dielectric layer $490_4$, for example, is a silicon oxide layer. Other types of dielectric layers may also be useful. The dielectric layer may be formed by CVD. Other techniques for forming the dielectric layer may also be useful. Excess dielectric layer may be removed by, for example, CMP to expose the BE and providing a planar top surface. In other cases, no dielectric layer is formed. For example, the dielectric layer is formed after forming and patterning of the layers of the MTJ element to form the MTJ element.

In FIG. 4o, the process continues to form a MTJ element 420 of a voltage control magnetic device. In one embodiment, the MTJ element is a top pinned MTJ element. The top pinned MTJ element may be a iMTJ element or a pMTJ element. As shown, various layers of the MTJ stack are sequentially formed on the dielectric layer and BE. For example, a free magnetic layer 428, a tunneling barrier layer 427, a reference layer 424 and a SAF layer 434 are sequentially formed on the dielectric layer $490_4$. A top electrode layer 432 is formed over the MTJ layers. Providing other MTJ layers may also be useful. The various layers may be formed by, for example, PVD. Other deposition techniques may also be useful.

Referring to FIG. 4p, the various MTJ layers and top electrode layer are patterned to form the MTJ element 420. Patterning the layers may be achieved using an anisotropic etch, such as RIE, with a patterned mask layer. Other techniques for forming the MTJ element 420 in FIG. 4p may also be useful.

Referring to FIG. 4q, a dielectric layer $490_5$ is formed over and covers the MTJ element 420, including the top electrode layer 432. The dielectric layer $490_5$, for example, is a silicon oxide layer. The dielectric layer $490_5$ may be formed by, for example, CVD. Other types of dielectric layers or forming techniques may also be useful. The dielectric layer, for example, serves as via and metal levels of an ILD layer. For example, the dielectric layer $490_5$ serves as MTJD layer which includes V2 and M3. Other ILD levels may also be useful. If necessary, a planarization process, such as CMP, may be performed to produce a planar surface.

As shown in FIG. 4r, a conductive or metal line is formed and patterned in the dielectric layer $490_5$ and on the top electrode layer 432 of the MTJ element 420. The metal line may be formed using, for example, damascene technique. The metal line may be patterned to form, for example, a bit line BL in the dielectric layer $490_5$. This provides a connection for the MTJ element 420 to BL and couples the MTJ element 420 to the BL. Additional processes may be performed to complete forming the device. For example, the processes may include forming additional ILD levels, pad level, passivation level, pad opening, dicing, assembly and testing. Other types of processes may also be performed.

FIGS. 5a-5j show cross-sectional views of another embodiment of a process 500 for forming a voltage control magnetic device. The voltage control magnetic device, for example, is the same or similar to that described in FIGS. 2b, 3b and 4a-4r. Common elements may not be described or described in detail.

Figure 5A:
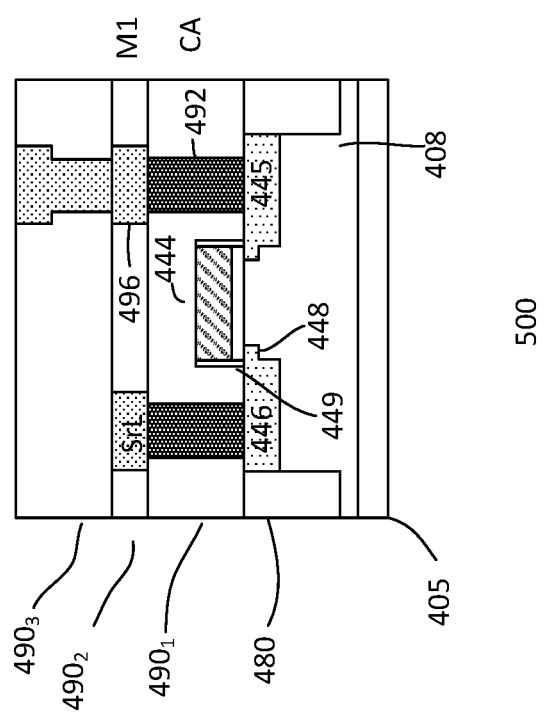
FIGS. 5a-5j show cross-sectional views of another embodiment of a process for forming a voltage control magnetic device.

As shown in FIG. 5a, a partially processed substrate is provided. The substrate is processed to a stage similar to that described in FIG. 4i. Up to this stage, process 500 is the same as process 400 with the exception that no DL is formed in M2.

Figure 5B:
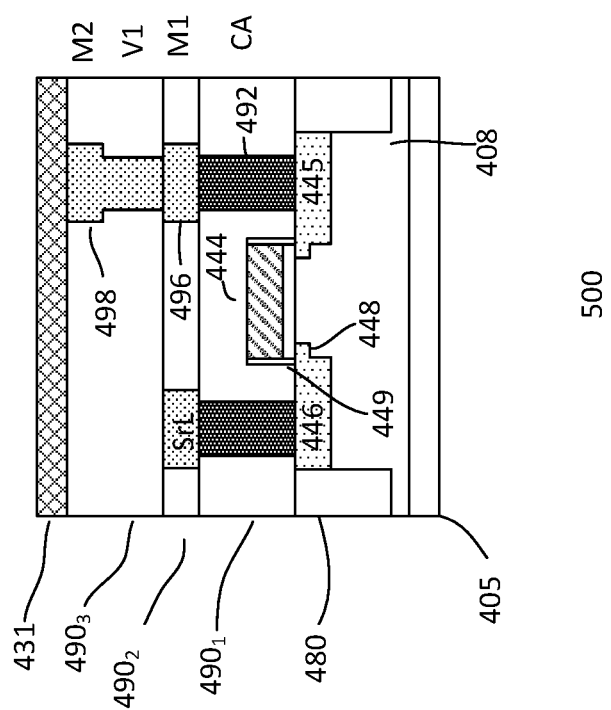
Figure 5C:
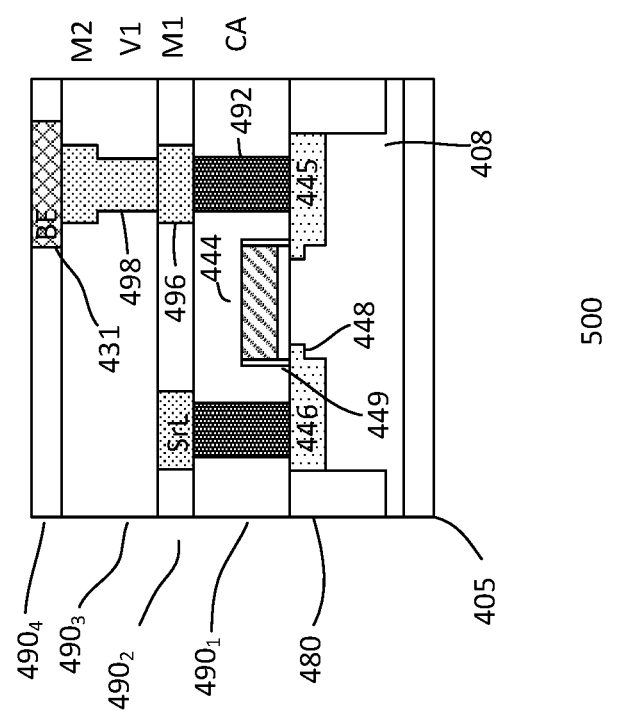

Referring to FIG. 5b, a bottom electrode layer 431 of a MTJ element is formed over the dielectric layer $490_3$. Referring to FIG. 5c, the bottom electrode layer 431 is patterned and the gaps left are filled by a dielectric layer $490_4$. The bottom electrode layer 431 is patterned such that the footprint of the bottom electrode layer 431 is sufficient to serve as a bottom electrode of the MTJ element and to be in electrical contact with the pad-contact unit 498 in M2 and V1 which is coupled to the drain region 445 of the transistor.

The dielectric layer $490_4$, for example, is a silicon oxide layer. Other types of dielectric layers may also be useful. The dielectric layer may be formed by CVD. Other techniques for forming the dielectric layer may also be useful. Excess dielectric layer may be removed by, for example, CMP to expose the BE and providing a planar top surface.

Figure 5D:
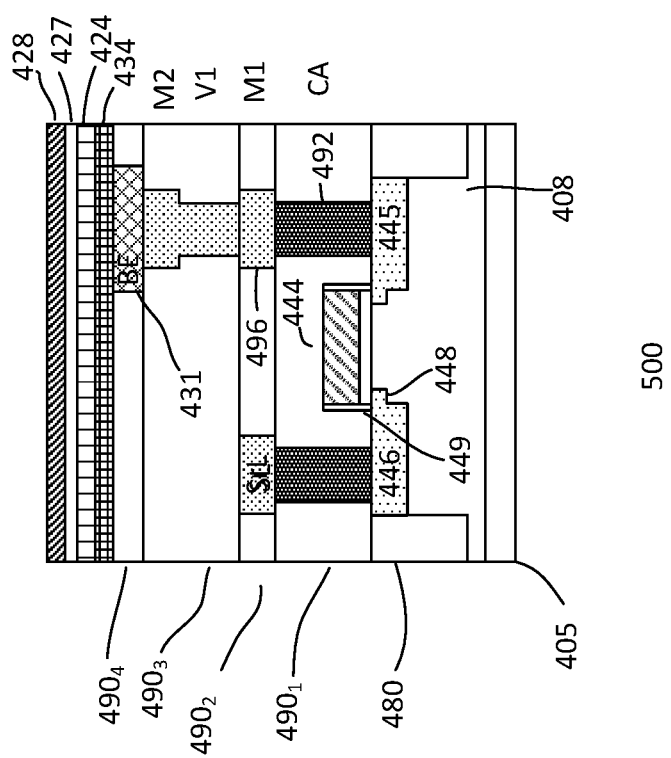
Figure 5E:
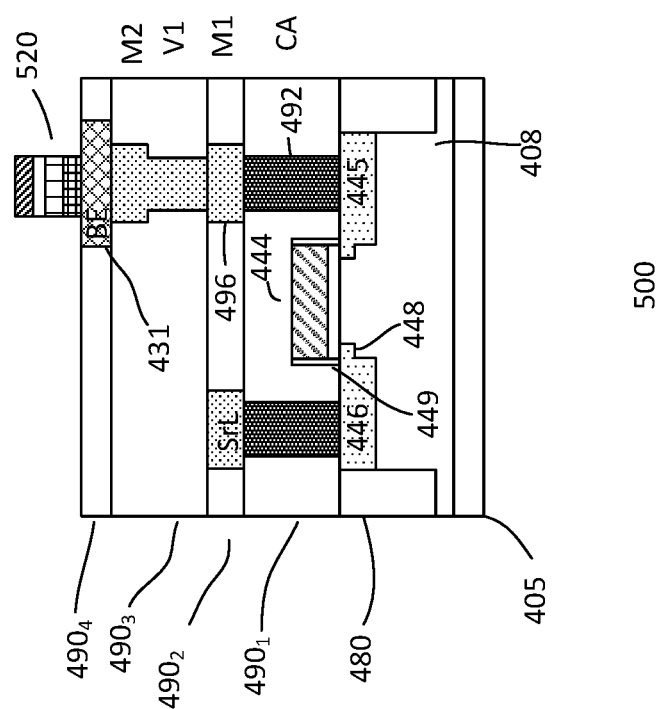

Referring to FIG. 5d, the process 500 continues to form various layers of the MTJ element. The various layers, in one embodiment, form a bottom pinned MTJ element. The bottom pinned MTJ element may be a iMTJ element or a pMTJ element. As shown, various layers of the MTJ stack are sequentially formed on the dielectric layer and BE. For example, a SAF layer 434, a reference layer 424, a tunneling barrier layer 427 and a free layer 428 are sequentially formed on the dielectric layer $490_4$. The various layers may be formed by, for example, PVD. Other deposition techniques may also be useful. The various MTJ layers are patterned to form the bottom pinned MTJ element 520, as shown in FIG. 5e.

Figure 5F:
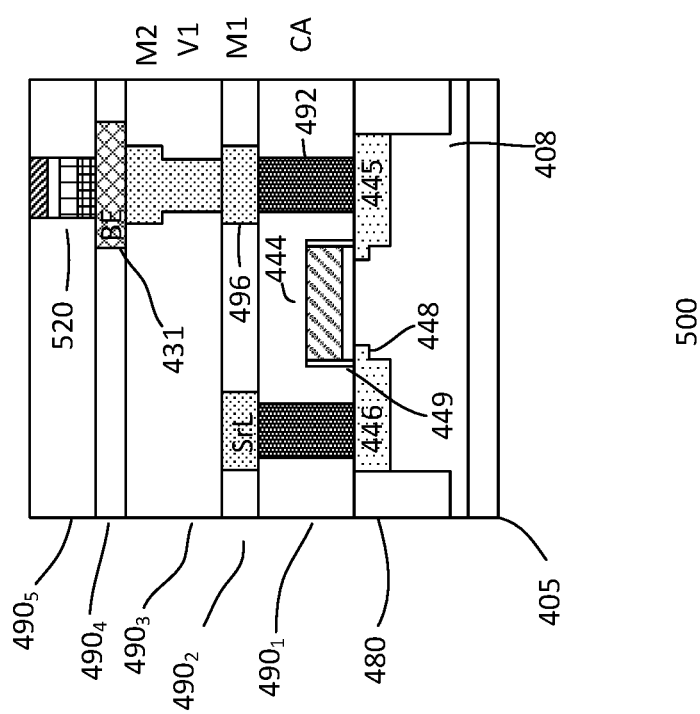

Referring to FIG. 5f, a dielectric layer $490_5$ is formed to cover the gaps left. Excess dielectric material are removed by, for example, CMP. The CMP exposes the top of the MTJ element and produces a planar top surface.

Figure 5G:
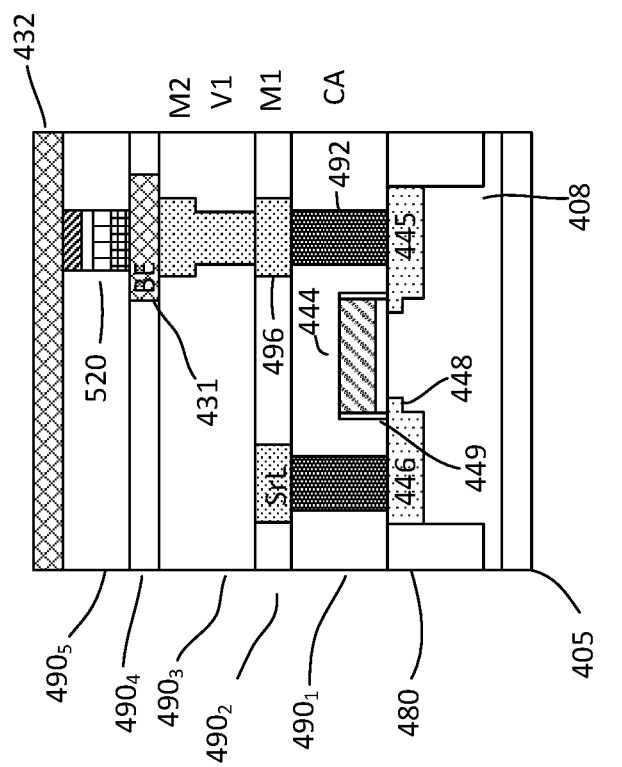
Figure 5H:
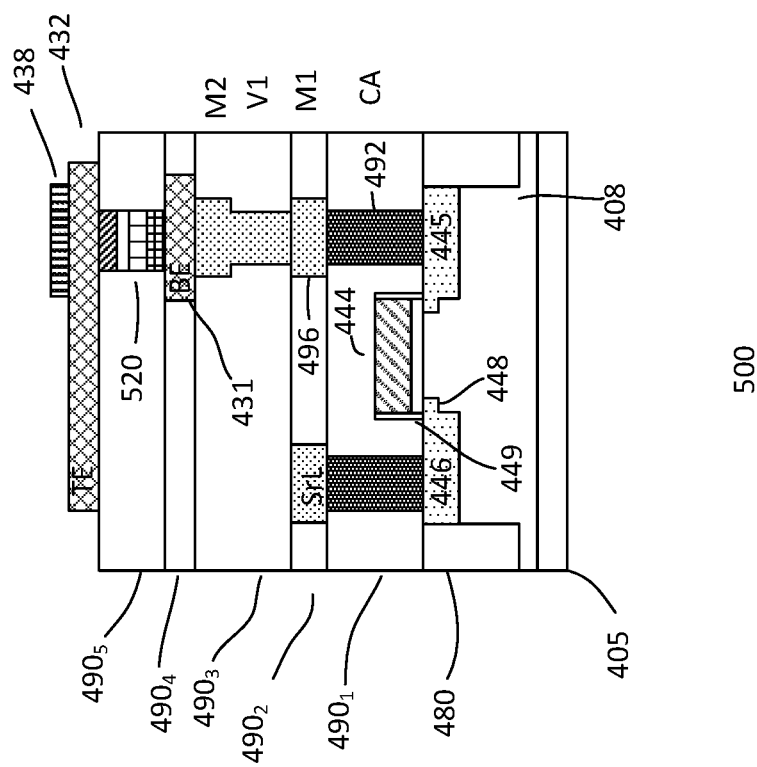

In FIG. 5g, a top electrode layer 432 of the MTJ element 520 is formed. The top electrode layer covers the dielectric layer and MTJ element. The top electrode layer 432 may be patterned to form an extended top electrode TE, as shown in FIG. 5h. The extended TE is coupled to the MTJ element should have a footprint sufficient to accommodate a bitline BL and a SIM unit. In one embodiment, a strain induced layer 438 is provided over the TE. For example, a strain induced layer is blanket deposited and patterned to form the strain induced layer over the TE. In other embodiments, both the top electrode layer and strain induced layer may be deposited on the dielectric layer and MTJ element. The strain induced layer is patterned followed by patterning the top electrode layer.

In other embodiments, the top electrode and strain induced layer may have a coplanar top surface. For example, after patterning the strain induced layer, another TE layer is formed and planarized by, for example, CMP to expose the top of the pattern strain induced layer and to provide a planar top surface with the top electrode layer. Subsequently, the top electrode is patterned to form TE.

Figure 5I:
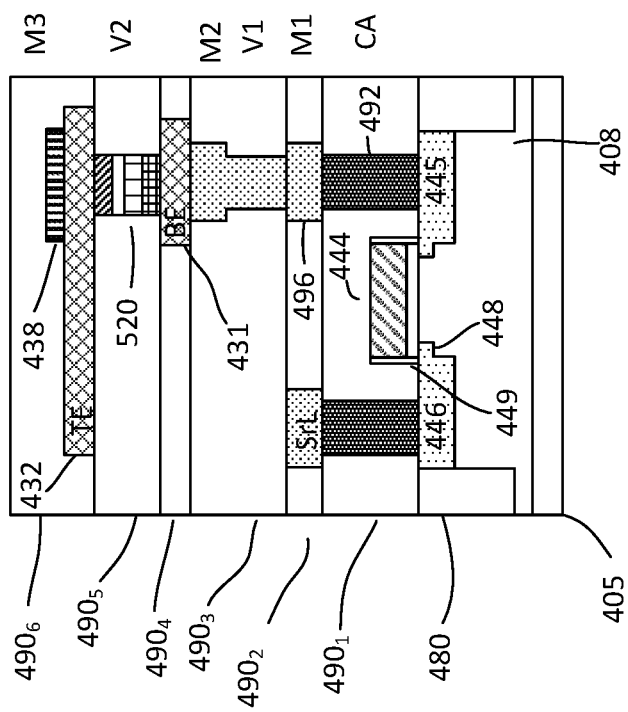

Referring to FIG. 5i, a dielectric layer $490_6$ is formed over and covers the TE and SIM unit. The dielectric layer $490_6$, for example, is a silicon oxide layer. The dielectric layer $490_6$ may be formed by, for example, CVD. Other types of dielectric layers or forming techniques may also be useful. The dielectric layer, for example, serves as via and metal levels of an ILD layer. For example, the dielectric layer $490_6$ serves as an upper part of the MTJD layer which includes V2 and M3. Other ILD levels may also be useful. If necessary, a planarization process, such as CMP, may be performed to produce a planar surface.

Figure 5J:
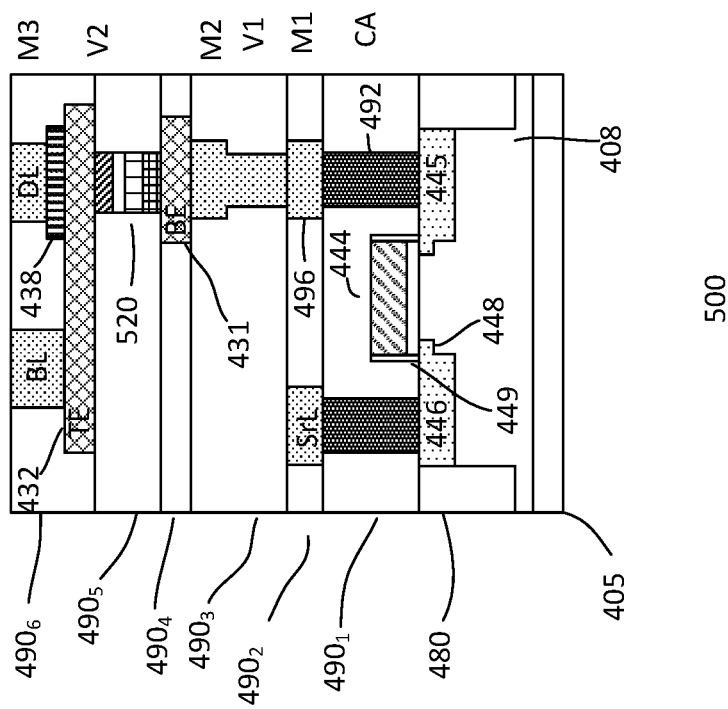

In FIG. 5j, conductive or metal lines are formed in, for example, M3. The metal line may be formed using, for example, damascene technique. The metal line may be patterned to form, for example, a bit line BL and DL in the dielectric layer $490_6$. The BL is coupled to the TE and the DL is coupled to the strain induced layer. The DL may also be coupled to the TE along with the strain induced layer. Additional processes may be performed to complete forming the device. For example, the processes may include forming additional ILD levels, pad level, passivation level, pad opening, dicing, assembly and testing. Other types of processes may also be performed.

The embodiments as described result in various advantages. The embodiments as described enables detection of external RF that matches the precessional frequency of the free magnetic layer of the MTJ element. Furthermore, the embodiments also enable the precessional frequency of the free layer of the MTJ element to be tuned by applying voltage across the strain induced/magnetoelectric layer thereby making it possible to tune and detect RF signals of various frequencies. Moreover, the processes as described are also highly compatible with CMOS logic processing and could be implemented using current technology and equipment.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A magnetic device comprising:
   a magnetic tunnel junction (MTJ) element disposed between a first and a second electrode, wherein the MTJ element is directly coupled to a first major surface of the first and second electrodes, wherein the first and second electrodes define a first and a second MTJ terminal respectively, wherein the MTJ element comprises
      a fixed layer and a free layer, wherein the free layer is disposed between the first electrode and the fixed layer
      a tunnel barrier sandwiched between the fixed and free layers, and
      wherein the free layer includes a predetermined precessional frequency, wherein the free layer undergoes Rabi oscillation in the presence of a first radio frequency (RF) signal matching the predetermined precessional frequency;
   a strain induced magnetoelectric (SIM) unit coupled to the first MTJ terminal, wherein the SIM unit comprises a stress induced layer disposed within the first electrode of the MTJ element, wherein a partial thickness of the first electrode separates the stress induced layer from the MTJ element, wherein the first electrode covers a first major surface and sides of the stress induced layer, wherein a second major surface of the stress induced layer is substantially coplanar with a second major surface of the first electrode; and
   a digital line directly coupled to the second major surface of the stress induced layer, wherein the digital line is biased to apply a voltage to the stress induced layer to induce a strain on the first electrode, wherein inducing the strain on the first electrode changes the precessional frequency of the free layer from the predetermined precessional frequency to a tuned precessional frequency, wherein the free layer undergoes Rabi oscillation in the presence of a second RF signal matching the tuned precessional frequency.

2. The device of claim 1 wherein a magnitude of the strain on the first electrode defines the tuned precessional frequency, wherein a change in the magnitude of the strain on the first electrode corresponds with a change to the tuned precessional frequency.

3. The device of claim 2 wherein the magnitude of the strain on the first electrode is defined by a magnitude of the voltage applied to the stress induced layer, wherein the tuned precessional frequency is adjustable by adjusting the magnitude of the voltage applied to the stress induced layer.

4. The device of claim 1 wherein the predetermined precessional frequency is a first desired precessional frequency and the tuned precessional frequency is a second desired precessional frequency, wherein the second RF signal comprises a different radio frequency from the first RF signal.

5. The device of claim 1 wherein a footprint of the stress induced layer is larger than a footprint of the free layer.

6. The device of claim 1 wherein the first electrode is a top electrode disposed over the MTJ element, wherein the second major surfaces of the stress induced layer and the first electrode are top surfaces, wherein the top surface of the stress induced layer is coplanar with the top surface of the first electrode.

7. The device of claim 1 wherein the stress induced layer comprises a piezo electric material or a ferroelectric material.

8. The device of claim 1 wherein the first electrode is a bottom electrode disposed below the MTJ element, wherein the second major surfaces of the stress induced layer and the first electrode are bottom surfaces, wherein the bottom surface of the stress induced layer is coplanar with the bottom surface of the first electrode.

9. The device of claim 1 wherein a width of the stress induced layer is larger than a width of the MTJ element and a width of the digital line.

10. A method of forming a magnetic device comprising:
providing a substrate defined with a device region;
forming a selector unit on the substrate, wherein forming the selector unit comprises forming a select transistor;
forming a lower back-end dielectric layer, wherein the lower back-end dielectric layer includes one or more interlevel dielectric (ILD) levels;
forming a bottom electrode on the lower back-end dielectric layer;
forming a MTJ element on the bottom electrode, wherein the MTJ element includes
a fixed layer
a tunnel barrier,
a free layer, the free layer is separated from the fixed layer by the tunnel barrier, and
wherein the free layer includes a predetermined precessional frequency, wherein the free layer undergoes Rabi oscillation in the presence of a first radio frequency (RF) signal matching the predetermined precessional frequency;
forming a top electrode layer over the MTJ element;
forming a stress induced layer, wherein the stress induced layer is disposed within one of the top or the bottom electrode which is proximate to the free layer of the MTJ element, wherein a partial thickness of the top or the bottom electrode separates the stress induced layer from the MTJ element, wherein the top or the bottom electrode covers a first major surface and sides of the stress induced layer, wherein a second major surface of the stress induced layer is substantially coplanar with a second major surface of the top or the bottom electrode;
forming a digital line directly coupled to the second major surface of the stress induced layer, wherein the digital line is biased to apply a voltage to the stress induced layer to induce a strain on the top or the bottom electrode, wherein inducing the strain on the top or the bottom electrode changes the precessional frequency of the free layer from the predetermined precessional frequency to a tuned precessional frequency, wherein the free layer undergoes Rabi oscillation in the presence of a second RF signal matching the tuned precessional frequency.

11. The method of claim 10 wherein:
the electrode proximate to the free layer comprises the bottom electrode;
the stressed induced layer is disposed within the bottom electrode below the MTJ element;
the digital line is disposed below the stress induced layer; and
the bottom electrode comprises an extended bottom electrode for accommodating the stress induced layer and coupling a pad interconnect for connecting to a first terminal of the select transistor.

12. The method of claim 11 wherein the stress induced layer comprises a piezo electric material or a ferroelectric material.

13. The method of claim 10 wherein the predetermined precessional frequency is a first desired precessional frequency and the tuned precessional frequency is a second desired precessional frequency, wherein the second RF signal comprises a different radio frequency from the first RF signal.

14. The method of claim 10 wherein:
the electrode proximate to the free layer comprises the top electrode;
the stressed induced layer is disposed within the top electrode over the MTJ element;
the digital line is disposed above the stress induced layer; and the top electrode comprises an extended top electrode for accommodating the stress induced layer, digital line and the BL.

15. The method of claim 14 wherein the stress induced layer comprises a piezoelectric material or a ferroelectric material.

16. The method of claim 10 wherein a footprint of the stress induced layer is larger than a footprint of the free layer.

* * * * *